(12) United States Patent
Ogiwara

(10) Patent No.: US 6,944,046 B2
(45) Date of Patent: Sep. 13, 2005

(54) FERROELECTRIC MEMORY AND METHOD OF TESTING THE SAME

(75) Inventor: Ryu Ogiwara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 109 days.

(21) Appl. No.: 10/716,565

(22) Filed: Nov. 20, 2003

(65) Prior Publication Data

US 2004/0179385 A1 Sep. 16, 2004

(30) Foreign Application Priority Data

Mar. 14, 2003 (JP) .......................................... 2003-070147

(51) Int. Cl.[7] .......................... G11C 11/22; G11C 11/24
(52) U.S. Cl. ........................................ 365/145; 365/149
(58) Field of Search .................................. 365/145, 149

(56) References Cited

U.S. PATENT DOCUMENTS

| | | | |
|---|---|---|---|
| 5,661,730 A | | 8/1997 | Mitra et al. |
| 5,822,237 A | | 10/1998 | Wilson et al. |
| 5,903,492 A | | 5/1999 | Takashima |
| 5,959,922 A | * | 9/1999 | Jung ........................... 365/145 |
| 5,991,189 A | | 11/1999 | Miwa |
| 6,191,971 B1 | * | 2/2001 | Tanaka et al. ............... 365/145 |
| 6,373,744 B1 | * | 4/2002 | Mano .......................... 365/145 |
| 6,496,428 B2 | * | 12/2002 | Ohno et al. .................. 365/145 |
| 6,510,072 B2 | * | 1/2003 | Kang ........................... 365/145 |
| 6,512,686 B2 | * | 1/2003 | Miyamoto .................... 365/145 |

FOREIGN PATENT DOCUMENTS

JP  2000-268599  9/2000

OTHER PUBLICATIONS

Joseph M. Benedetto, et al., "Effects of operating conditions on the fast–decay component of the retained polarization in lead zirconate titanate thin films", J.Appl Phys. 75 (1), Jan. 1, 1994.

* cited by examiner

*Primary Examiner*—Trong Phan
(74) *Attorney, Agent, or Firm*—Oblon, Spivak, McClelland, Maier & Neustadt, P.C.

(57) ABSTRACT

A ferroelectric memory comprising a plurality of memory cells each including a ferroelectric capacitor and a switch transistor, and operating in a test mode in which, after polarized data is written into the memory cell by applying a first electric potential difference between both electrodes of ferroelectric capacitors of the plurality of memory cells, and before reading of the polarized data from the memory cells is carried out, a second electric potential difference smaller than the first electric potential difference is applied between both the electrodes of the ferroelectric capacitors in a direction opposite to that at the time of writing the polarized data.

23 Claims, 29 Drawing Sheets

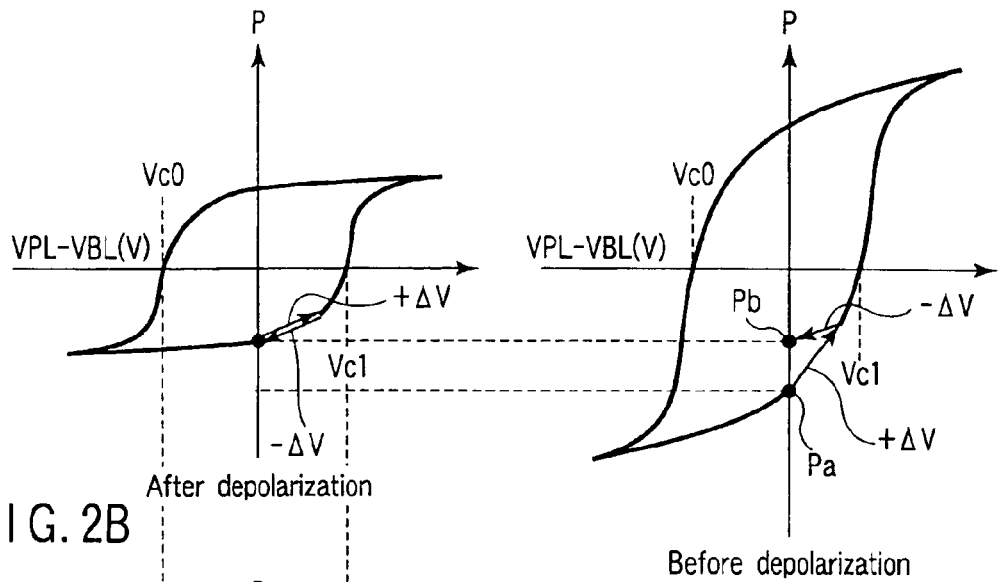
FIG. 2B  After depolarization
FIG. 2A  Before depolarization
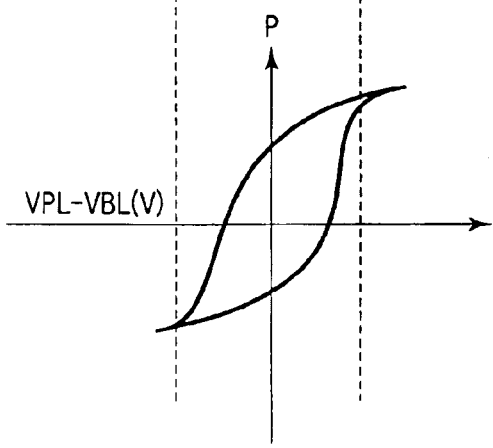
FIG. 2C
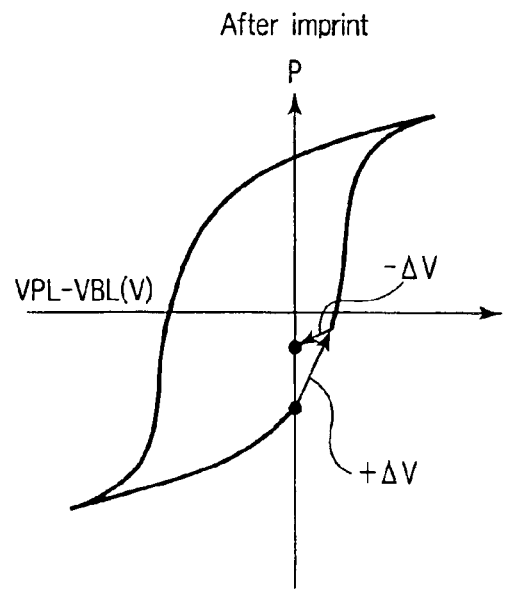
After imprint
FIG. 3

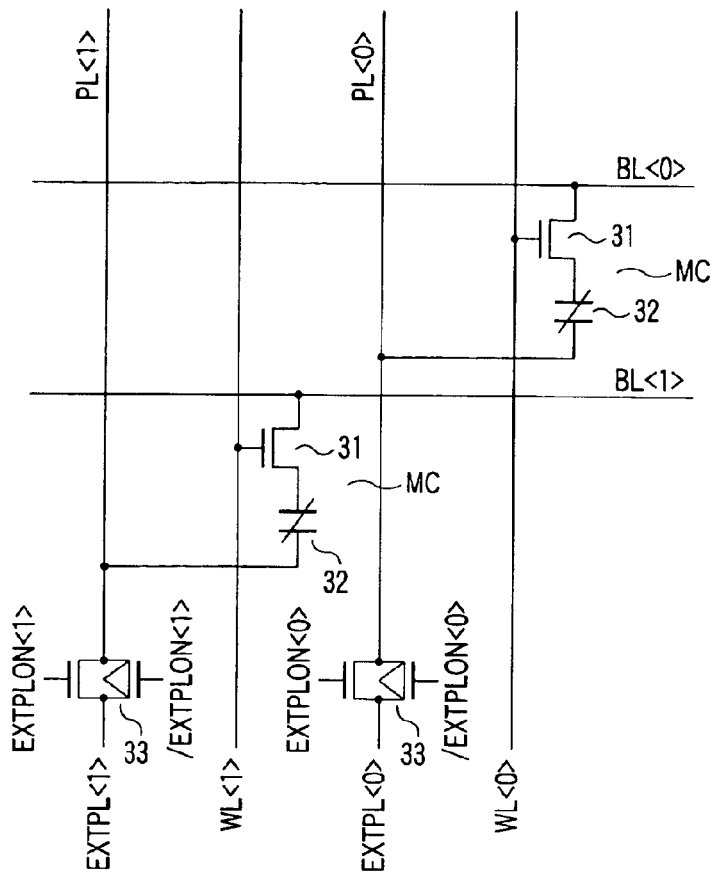
FIG. 5
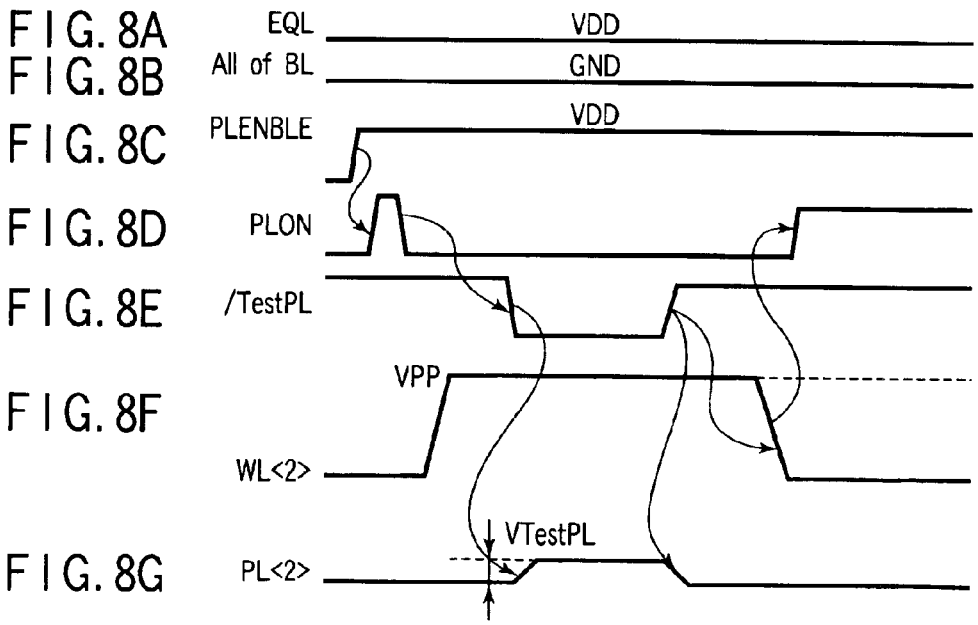

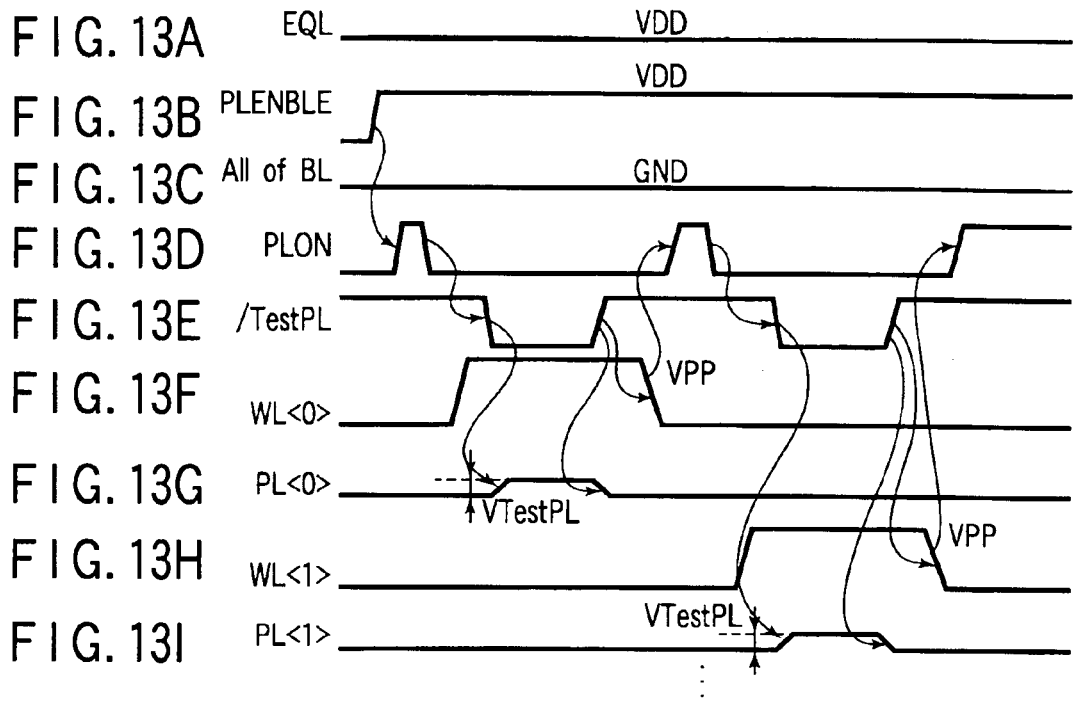
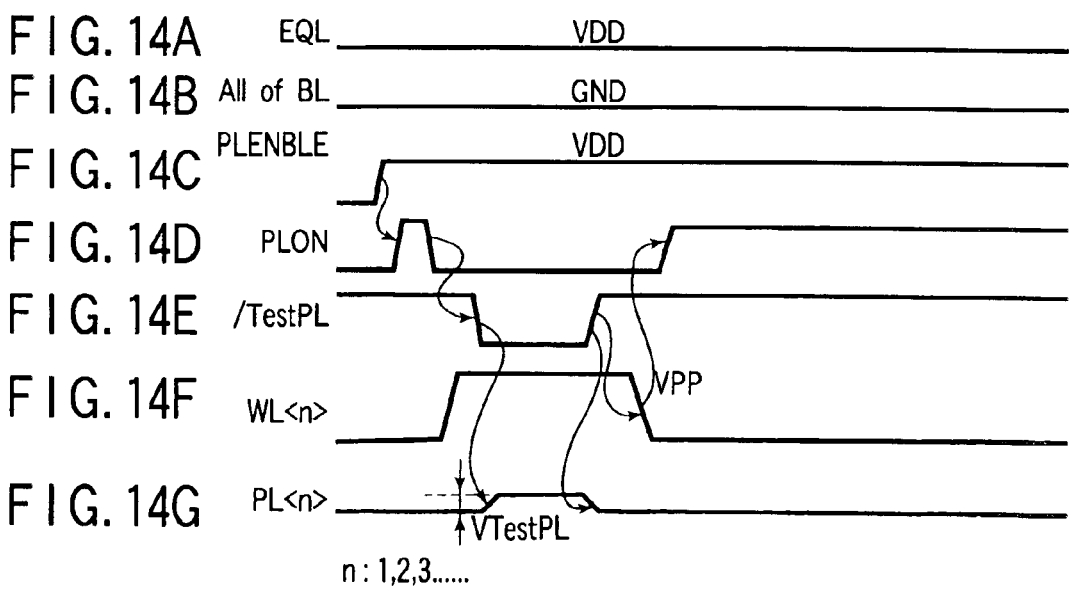

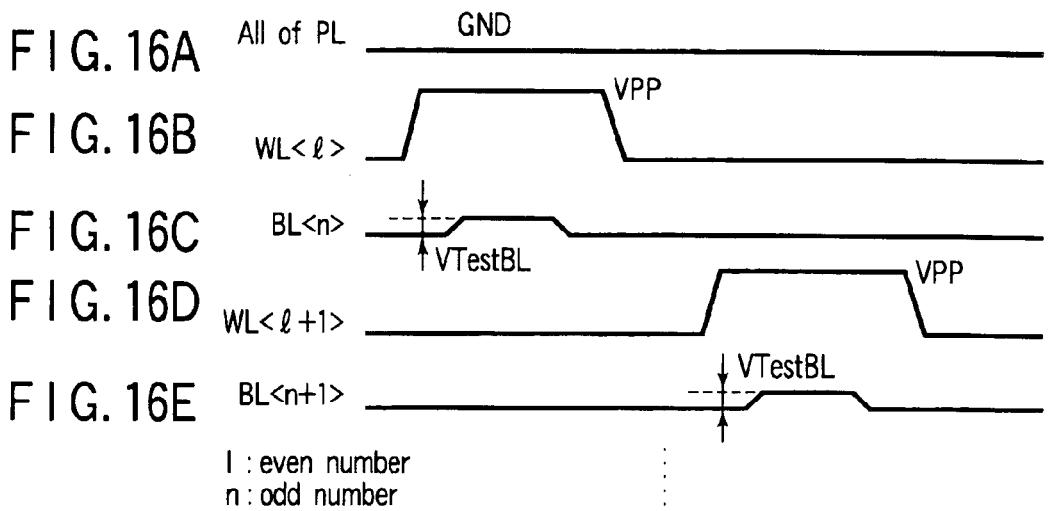
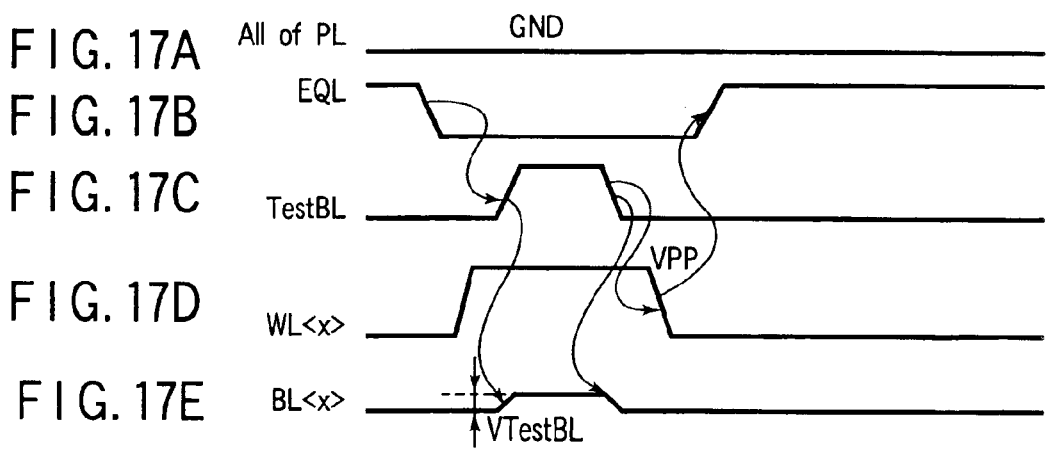

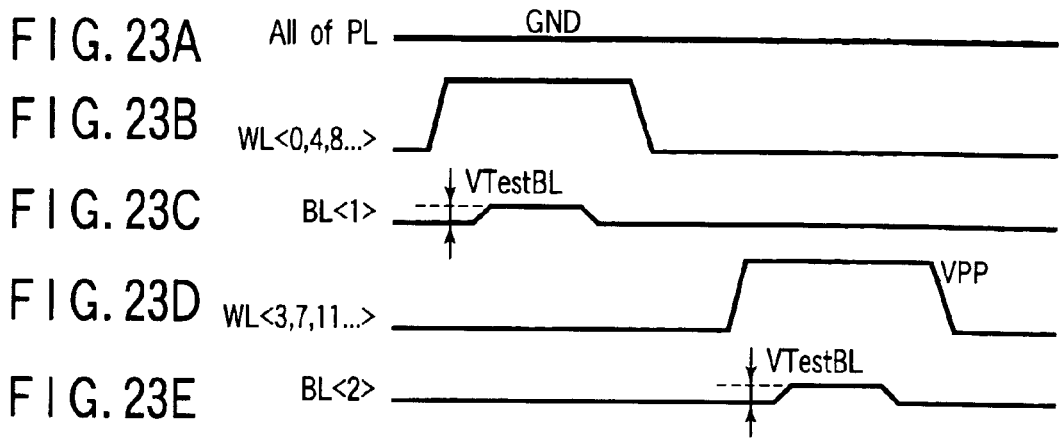
FIG. 23A All of PL — GND
FIG. 23B WL<0,4,8...>
FIG. 23C BL<1> ↕VTestBL
FIG. 23D WL<3,7,11...> VPP
FIG. 23E BL<2> ↕VTestBL
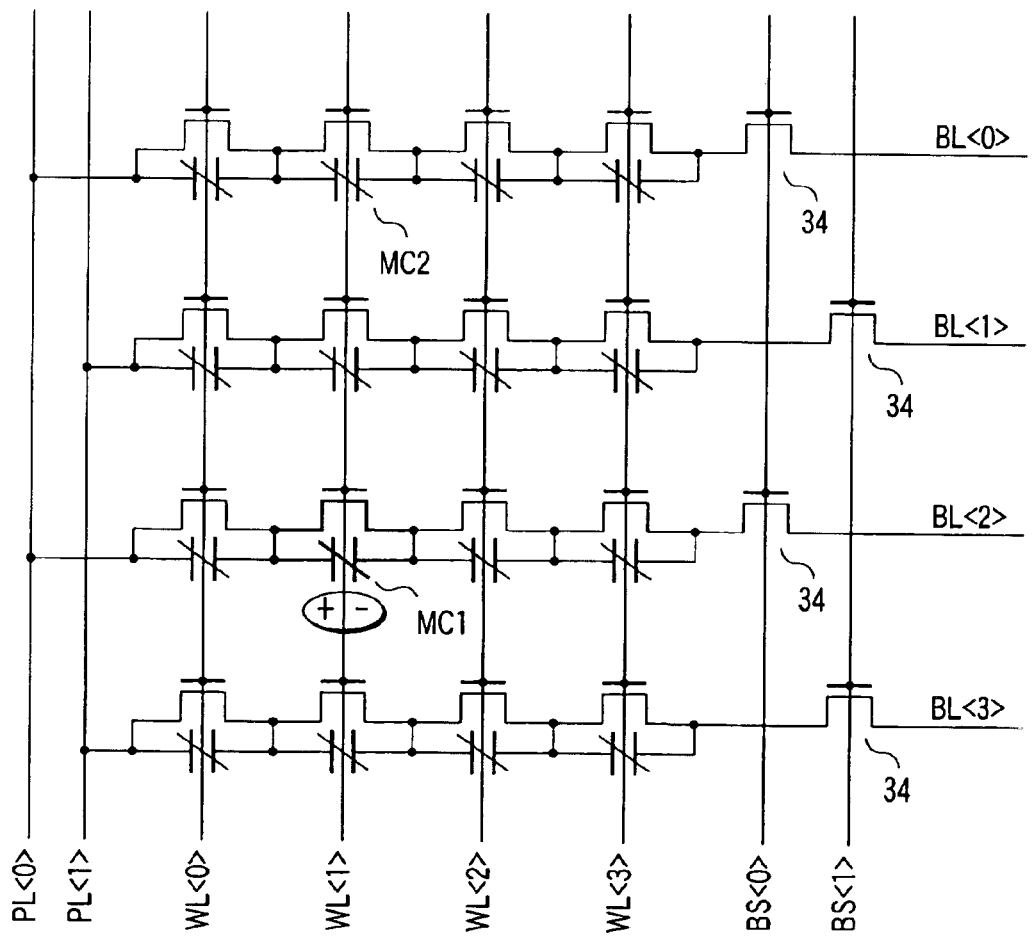
FIG. 24

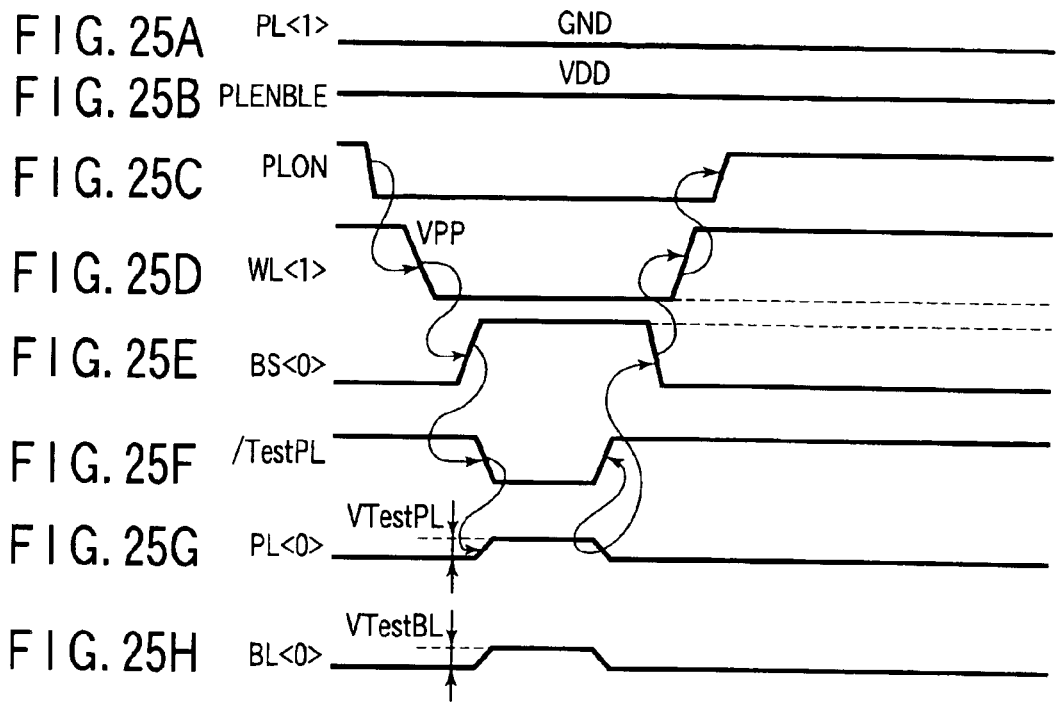
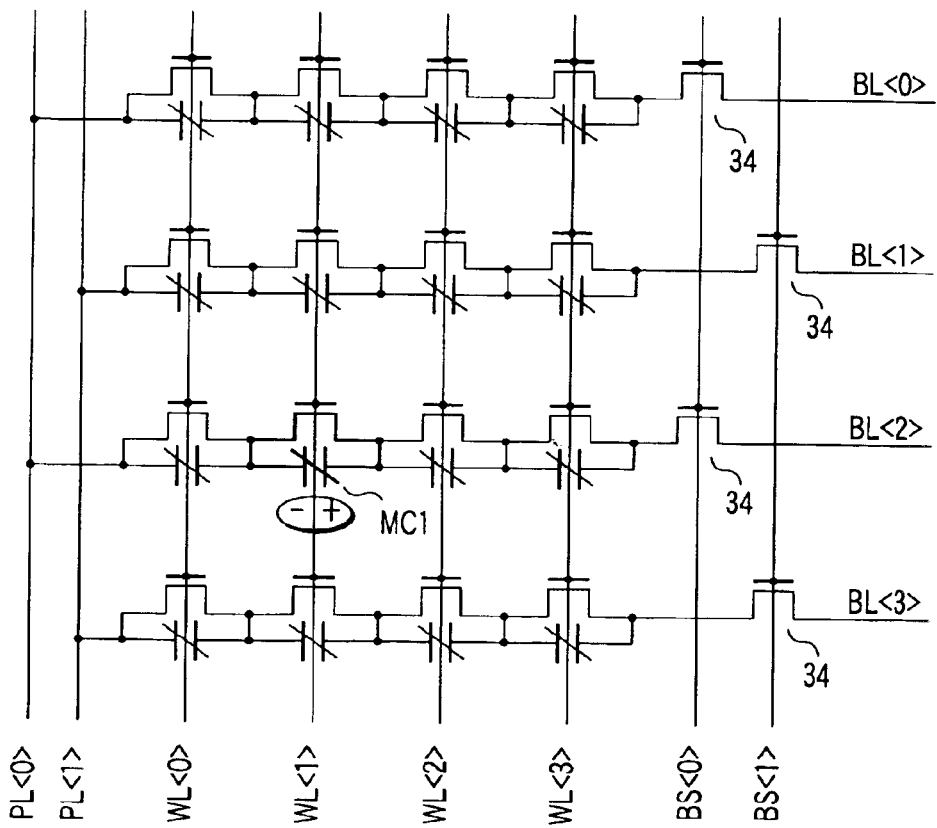
FIG. 26

FIG. 27A PL<0>
FIG. 27B EQL
FIG. 27C WL<1>
FIG. 27D BS<0>
FIG. 27E TestBL
FIG. 27F BL<2>

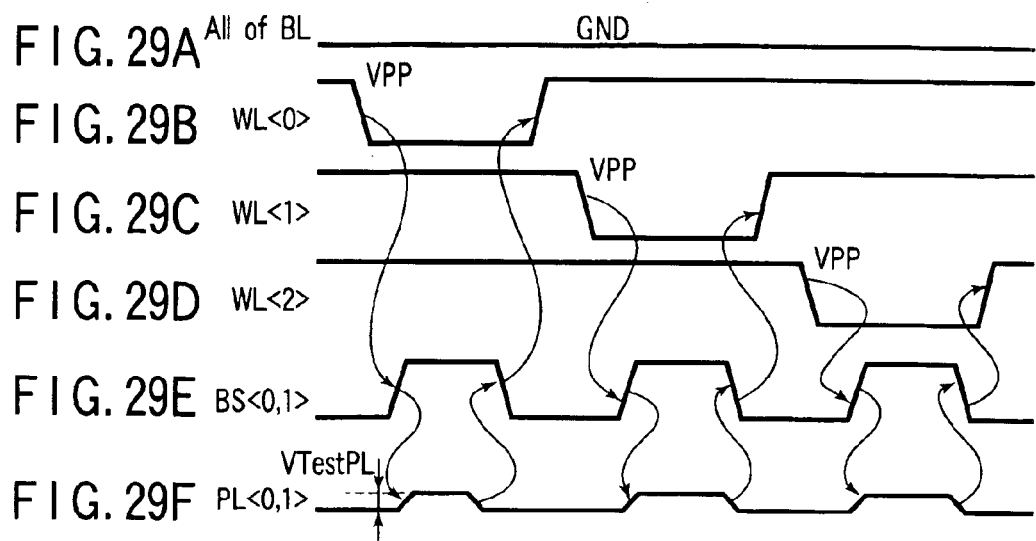
FIG. 29A All of BL
FIG. 29B WL<0>
FIG. 29C WL<1>
FIG. 29D WL<2>
FIG. 29E BS<0,1>
FIG. 29F PL<0,1>
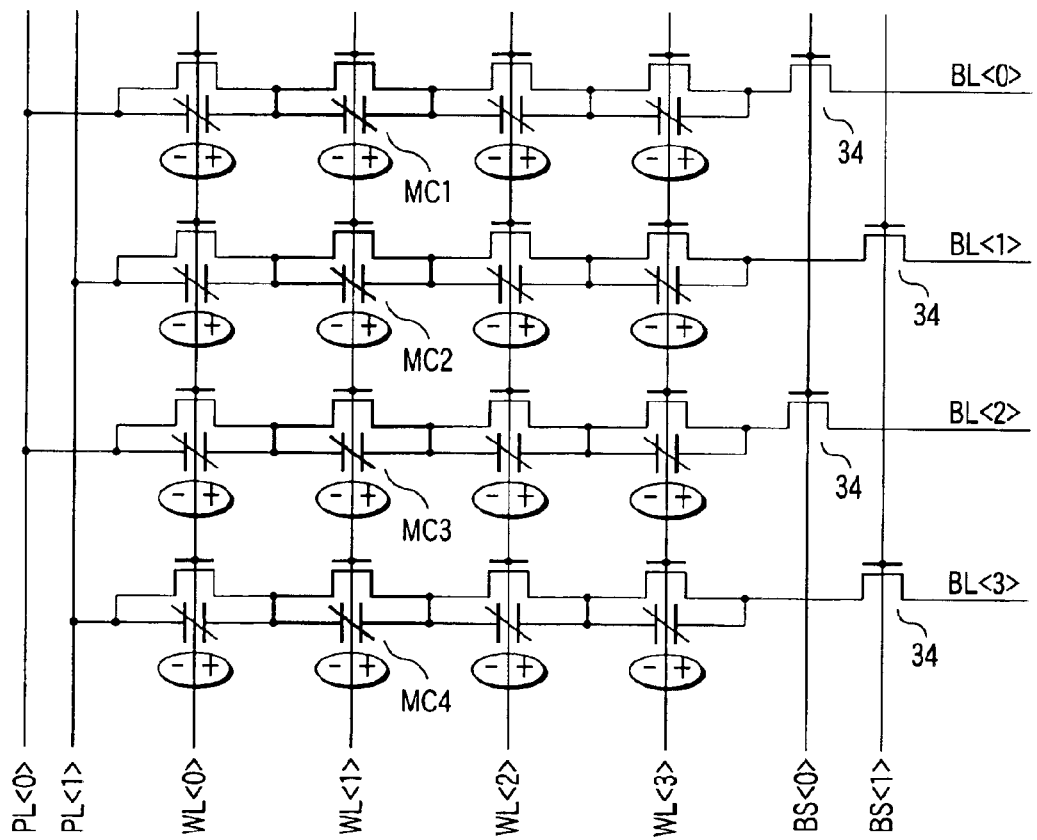
FIG. 30

FIG. 31A  All of PL
FIG. 31B  WL<0>
FIG. 31C  WL<1>
FIG. 31D  WL<2>
FIG. 31E  BS<0,1>
FIG. 31F  BL<0,1,2,3>

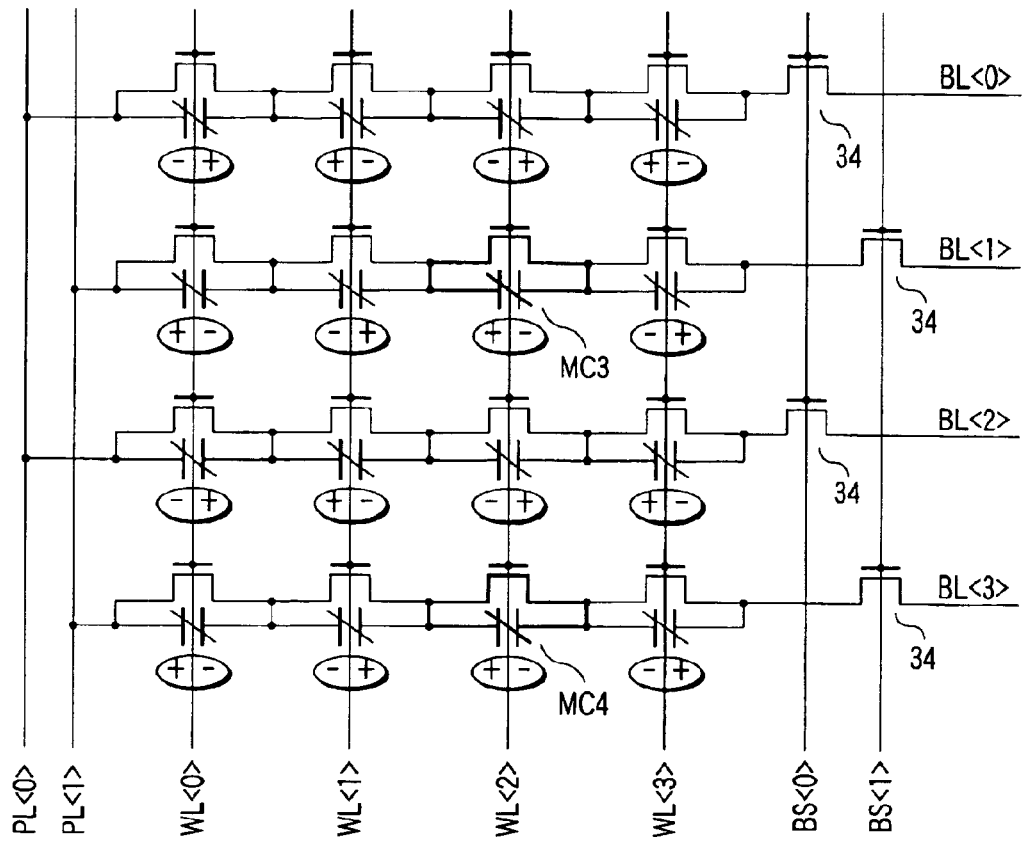
FIG. 33
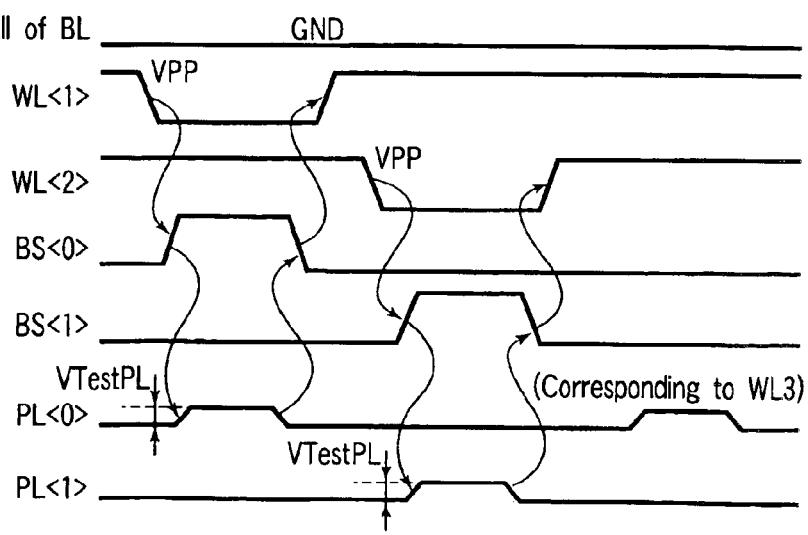

FIG. 37A All of PL
FIG. 37B WL<1>
FIG. 37C WL<2>
FIG. 37D BS<0>
FIG. 37E BS<1>
FIG. 37F BL<1,3>
FIG. 37G BL<0,2>

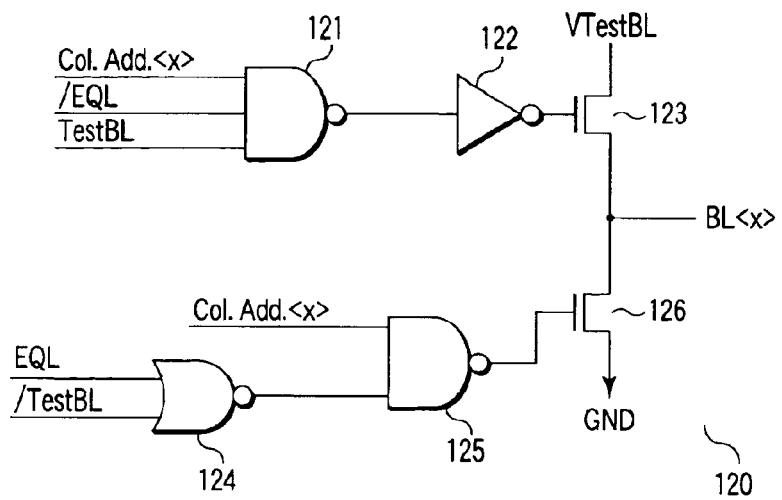
F I G. 44
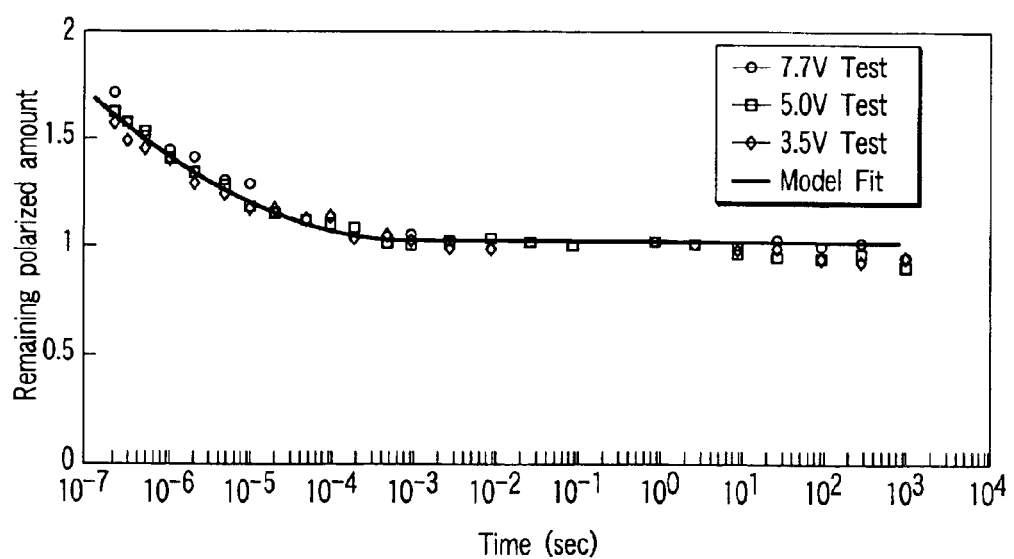
F I G. 45

Depolarization前

Depolarization後

FERROELECTRIC MEMORY AND METHOD OF TESTING THE SAME

CROSS-REFERENCE TO RELATED APPLICATIONS

This application is based upon and claims the benefit of priority from the prior Japanese Patent Application No. 2003-070147, filed Mar. 14, 2003, the entire contents of which are incorporated herein by reference.

BACKGROUND OF THE INVENTION

1. Field of the Invention

The present invention relates to a ferroelectric memory having a ferroelectric memory cell, and in particular, to a ferroelectric memory having a function which evaluates a polarized amount in a ferroelectric memory cell after data is written, and to a method of testing the same.

2. Description of the Related Art

The ferroelectric memory is known as a nonvolatile semiconductor memory storing the logical value data "0", "1" as a polarized amount by using the hysteresis characteristic which a ferroelectric capacitor has. In order to evaluate the hysteresis characteristic of the ferroelectric capacitor, a predetermined data pattern is written after the ferroelectric memory is manufactured, and thereafter, the data pattern is read. Thereafter, by comparing the data pattern with the written data, the polarized amount in the ferroelectric memory cell is evaluated.

Conventionally, with respect to evaluation of a polarized amount of the ferroelectric memory cell, methods such as that described in, for example, U.S. Pat. No. 5,661,730 (Document 1), U.S. Pat. No. 5,991,189 (Document 2), U.S. Pat. No. 5,822,237 (Document 3), and Jpn. Pat. Appln. KOKAI Publication No. 2000-268599 (Document 4), are proposed.

The methods described in these documents are not structured such that the reading of the data is carried out immediately after data is written, or reading is carried out after a sufficient time after the data is written. Therefore, there is the possibility that the data is read before a sufficient attenuation of the polarized amount by depolarization arises. Further, even screening of the ferroelectric memory cell having the hysteresis characteristic in which a coercive voltage is small cannot be carried out.

FIG. 45 shows an example of an elapsed time variation characteristic by depolarization of a PZT ($PbZrTiO_3$) film which is a type of ferroelectric. Note that this characteristic is described in, for example, J. Appl. Phys. 75(1), 1 Jan., 1994. In FIG. 45, the ordinate expresses a remaining polarized amount which is normalized, and the abscissa expresses elapsed time (seconds) from the time of writing the data to the time of reading the data.

As known from FIG. 45, after the data is written into the ferroelectric memory cell, a stoppage of attenuation of the polarized amount requires a wait of $10^{-3}$ to $10^0$ (seconds). Namely, reading of the data from the ferroelectric memory cell in a state in which depolarization sufficiently arises requires waiting for a sufficient time after the writing. Accordingly, at the time of carrying out the test in which the data is read after being written, when an attempt is made to read the data after depolarization sufficiently has arisen, there is the problem that the cost required for the test increases.

Such a situation will be described by using a conventional testing method and the hysteresis characteristic of the ferroelectric memory cell.

FIG. 46 shows a flowchart of the testing method according to the invention described in U.S. Pat. No. 5,661,730. The testing methods are carried out in accordance with the following steps or sequences.

(1) Writing of an initial data pattern is carried out.

(2) Baking is carried out, namely, the memory cell is put at a high temperature place for a given time.

(3) The initial data pattern is read, and a defective cell (SS defect) is detected.

(4) Writing of an opposite data pattern which is a pattern opposite to the step (1): the initial data pattern is carried out.

(5) The opposite data pattern is read, and a defective cell (OS defect) is detected.

(6) Writing of the next data pattern is carried out.

(7) The above-described steps (2) to (6) are repeatedly carried out a large number of times while changing data patterns to be written.

Here, SS of the SS defect is the abbreviation of "same state", and is used in the meaning that written data is read as is, and OS of the OS defect is the abbreviation of "opposite state", and is used in the meaning that data which is opposite to the data written in a memory cell in advance is written, and the opposite data is read.

Here, if a sufficient time is not insured at the time of proceeding from step (4) to step (5), the polarized amount is read in a state in which depolarization is not sufficiently carried out.

Moreover, the above-described situation will be described by referring to FIGS. 47 and 48.

FIG. 47 shows a hysteresis characteristic curve of the ferroelectric memory cell (ferroelectric capacitor) in a state immediately after the opposite data pattern is written in step (4), i.e., before depolarization arises, in the test sequence shown in FIG. 46. Note that, in FIG. 47, VPL-VBL expresses an electric potential difference between plate lines and bit lines, and P expresses the polarized amount.

Here, it will be considered that a test on reading the opposite data pattern is carried out in step (6) in FIG. 46. In a case of the ferroelectric memory cell in which a long time is required for carrying out depolarization of the memory cell in which writing is carried out, as shown in FIG. 47, the remaining polarized amount is not attenuated yet at a point in time of reading the opposite data pattern, and, therefore, a high reading electric potential appears on the bit line.

On the other hand, in the ferroelectric memory cell in which depolarization is sufficiently carried out, as shown in FIG. 48, a low reading electric potential appears on the bit line. Note that Qsw in FIGS. 47 and 48 expresses a difference of the remaining polarized amounts of the written data "0" and "1".

The polarization of the ferromagnetic memory cell is evaluated after performing the depolarization. It is then determined whether a sufficient sense margin remains even after the signal has decreased in magnitude. Here arises a problem. After the writing of data an excessively long time inevitably passes before it is can be confirmed that a sufficient sense margin remains. This would raise the test cost, as pointed out earlier.

BRIEF SUMMARY OF THE INVENTION

A ferroelectric memory according to an aspect of the present invention comprising a plurality of memory cells each including a ferroelectric capacitor and a switch transistor, wherein the ferroelectric memory is configured to be operated in a test mode in which, after data is written into a memory cell by applying a first electric potential difference between both electrodes of a ferroelectric capacitor of the memory cell, and before reading of the data from the memory cell is carried out, a second electric potential difference smaller than the first electric potential difference is applied between both the electrodes of the ferroelectric capacitor in a direction opposite to that at the time of writing of the data.

According to another aspect of the present invention, there is provided a method of testing a ferroelectric memory comprising a plurality of memory cells each including a ferroelectric capacitor and a switch transistor, the method comprising: writing data into a memory cell by applying a first electric potential difference between both electrodes of the ferroelectric capacitor of the memory cell; weakening polarization of the ferroelectric capacitor by applying a second electric potential difference smaller than the first electric potential difference between both the electrodes of the ferroelectric capacitor of the memory cell in a direction opposite to that at the time of writing the data; and reading the data from the memory cell.

BRIEF DESCRIPTION OF THE SEVERAL VIEWS OF THE DRAWING

FIG. 2A is a characteristic graph showing a hysteresis characteristic curve of the ferroelectric memory according to one aspect of the present invention.

FIG. 2B is another characteristic graph showing a hysteresis characteristic curve of the ferroelectric memory according to one aspect of the present invention.

FIG. 2C is a further characteristic graph showing a hysteresis characteristic curve of the ferroelectric memory according to one aspect of the present invention.

FIG. 3 is a characteristic graph showing a hysteresis characteristic curve of a ferroelectric memory cell in which a coercive voltage is small.

FIG. 5 is a circuit diagram showing a structure of a cell array in the ferroelectric memory applicable to the present invention.

FIGS. 8A to 8G show, inclusively, a timing chart showing an example of the operation of the ferroelectric memory shown in FIG. 7.

FIGS. 13A to 13I show, inclusively, a timing chart showing an example of the operation of the ferroelectric memory shown in FIG. 12.

FIGS. 14A to 14G show, inclusively, a timing chart showing an example of the operation of a ferroelectric memory according to a fifth embodiment of the present invention.

FIGS. 16A to 16E show, inclusively, a timing chart showing an example of the operation of the ferroelectric memory shown in FIG. 15.

FIGS. 17A to 17E show, inclusively, a timing chart showing an example of the operation of a ferroelectric memory according to a seventh embodiment of the present invention.

FIGS. 23A to 23E show, inclusively, a timing chart showing an example of the operation of the ferroelectric memory shown in FIGS. 21 and 22.

FIG. 24 is a circuit diagram showing a structure of a portion of a cell array of a ferroelectric memory according to a tenth embodiment of the present invention.

FIGS. 25A to 25H show, inclusively, a timing chart showing an example of the operation of the ferroelectric memory shown in FIG. 24.

FIG. 26 is a circuit diagram showing a structure of a portion of a cell array of a ferroelectric memory according to an eleventh embodiment of the present invention.

FIGS. 27A to 27F show, inclusively, a timing chart showing an example of the operation of the ferroelectric memory shown in FIG. 26.

FIGS. 29A to 29F show, inclusively, a timing chart showing an example of the operation of the ferroelectric memory shown in FIG. 28.

FIG. 30 is a circuit diagram showing a structure of a portion of a cell array of a ferroelectric memory according to a thirteenth embodiment of the present invention.

FIGS. 31A to 31F show, inclusively, a timing chart showing an example of the operation of the ferroelectric memory shown in FIG. 30.

FIG. 33 is a circuit diagram showing a structure of another portion of a cell array of the ferroelectric memory according to the fourteenth embodiment of the present invention.

FIGS. 34A to 34G show, inclusively, a timing chart showing an example of the operation of the ferroelectric memory shown in FIGS. 32 and 33.

FIGS. 37A to 37G show, inclusively, a timing chart showing an example of the operation of the ferroelectric memory shown in FIGS. 35 and 36.

FIG. 44 a circuit diagram showing an example of an electric potential outputting circuit which outputs a bit line electric potential for use in the ferroelectric memory of the respective embodiments according to the present invention.

FIG. 45 a characteristic graph showing an example of an elapsed time variation characteristic of a remaining polarization amounts caused by depolarization of a ferroelectric film.

DETAILED DESCRIPTION OF THE INVENTION

First, before the description of embodiments of a ferroelectric memory and a method of testing the same, the principles thereof will be described by using a flowchart of FIG. 1 and hysteresis curve diagrams (hysteresis characteristic curve diagrams) of FIGS. 2A to 2C.

Ferroelectric memories according to various embodiments which will be described later operate in a normal mode in which normal data writing and reading are carried out, and in a test mode in which the data is read after writing the data, and evaluation of the polarized amount of a ferroelectric memory cell is carried out. Further, one of the test modes, as shown in the flowchart of FIG. 1, is a test in which a polarized amount of a ferroelectric memory cell is evaluated by the following sequences.

(1) Writing of an initial data pattern is carried out into the ferroelectric memory being tested.

(2) Baking is carried out, i.e., the memory is left in a high temperature atmosphere for a given time.

(3) The initial data pattern is read, and a defective cell (SS defect) in the memory is detected.

(4) Writing of an opposite data pattern which is a pattern opposite to the step (1) is carried out in the memory.

(5) An electric potential difference smaller than or equal to a coercive voltage is applied to a ferroelectric capacitor in the cell so as to weaken polarization of the capacitor.

(6) The opposite data pattern is read, and a defective cell (OS defect) is detected.

(7) Writing of the next data pattern is carried out into the ferroelectric memory.

(8) The above-described steps (2) to (7) are repeatedly carried out a large number of times while changing data patterns to be written.

Figure 1:
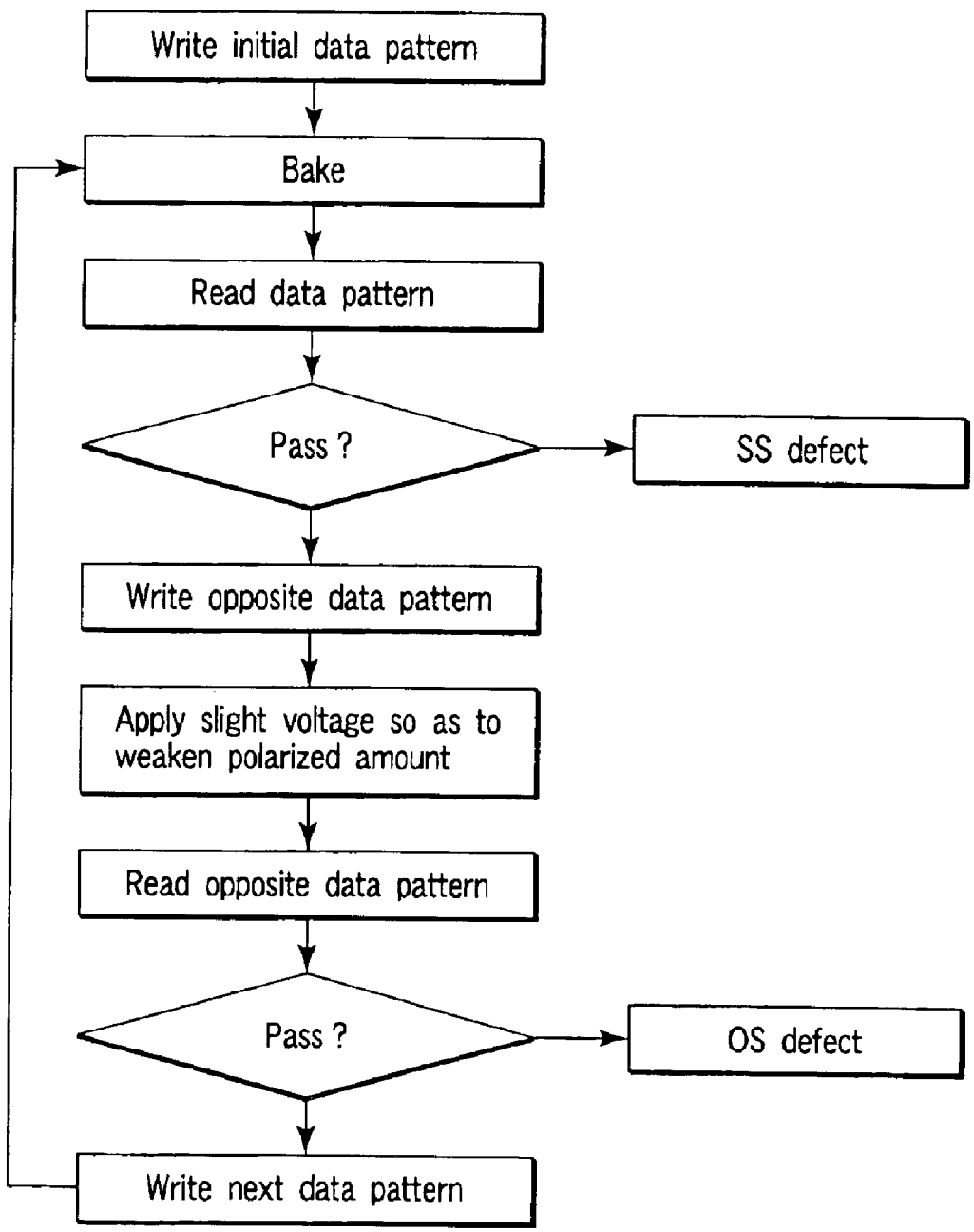
FIG. 1 is a flowchart for explanation of a testing method in a ferroelectric memory according to one aspect of the present invention.

Namely, the test sequence shown in FIG. 1 is different from a conventional sequence in that step (5) in FIG. 1 in which an electric potential difference smaller than the absolute value of the coercive voltage is applied to the ferroelectric capacitor is added between the step of writing the opposite data pattern and the step of reading the written opposite data pattern.

Due to the above-described step (5) being newly added, it is possible for the ferroelectric capacitor to have a polarized amount which is equal to that in a case where the ferroelectric capacitor is depolarized for a short time, and the test of step (6) on the polarized data which is in an effectively depolarized state can be carried out.

This situation will be described with reference to FIGS. 2A to 2C.

FIG. 2A shows a hysteresis characteristic curve of the ferroelectric memory cell (ferroelectric capacitor) immediately after the opposite data pattern is written in step (4). Note that, when writing of the data is carried out in step (4), an electric potential difference larger than the absolute value of the coercive voltage at the polarization hysteresis characteristic curve which the ferroelectric capacitor has is applied between both electrodes of the ferroelectric capacitor in the memory cell. The coercive voltage is shown by Vc0 or Vc1 in FIG. 2A.

Here, for example, it is supposed that the polarized amount after writing of the data is at the position of Pa as shown in FIG. 2A. Next, before the test of reading the opposite data pattern of step (6) is carried out, an electric potential difference (+ΔV) which is smaller than the absolute value of the coercive voltage (Vc1) is once applied to the ferroelectric memory cell (ferroelectric capacitor), so as to weaken polarization, and it is returned to 0V, as in step (5), as shown in FIG. 2A. As shown in FIG. 2A, the polarized amount moves to the position of Pb after applying of the electric potential difference (+ΔV). Namely, due to the above-described electric potential difference (+ΔV) being once applied, even in a case of the ferroelectric memory cell requiring a long time for being depolarized, a remaining polarized amount is attenuated, and depolarization is effectively carried out in a short time.

Accordingly, when the opposite data pattern is read in the following step (6), a low reading electric potential corresponding to the polarized amount after carrying out depolarization appears on a bit line.

Note that, with respect to such a ferroelectric memory cell which is depolarized for a short time after writing the data, even if an electric potential difference (+ΔV) smaller than the absolute value of the coercive voltage (Vc1) is applied so as to weaken polarization, as shown in FIG. 2B, it is empirically known that hardly any further reduction of the polarized amount arises.

Accordingly, even if a ferroelectric memory cell in which a time required for depolarization is long and a ferroelectric memory cell in which a time required for depolarization is short are mixed in a memory, due to step (5) being executed, a bit line electric potential corresponding to the remaining polarized amount after depolarization can be read in a short time.

Note that, as shown in FIG. 2C, at the time of step (5), in a case of a ferroelectric memory cell whose coercive voltage is originally small is applied with the electric potential difference (+ΔV), there is a possibility that polarization of the memory cell will be inverted. When the polarization of the memory cell is inverted, the memory cell is determined to be defective. However, in such a case, it is also significant in that screening of the defective ferroelectric memory cells can be carried out.

Incidentally, the memory described in above-described Document 4 as well has a test mode in which disturbance for weakening polarization is applied to the ferroelectric capacitor. However, the test mode described in Document 4 is different from the test mode in the present invention in the following points.

(1) The test mode described in Document 4 is for testing an attenuation of the polarized amount due to an extremely slight electric potential difference being repeatedly added by coupling with a parasitic capacity, and is not for obtaining in a short time an attenuation of the polarized amount which is equal to that in the case where depolarization arises.

(2) In the test mode described in Document 4, disturbance indirectly applied by coupling with a parasitic capacity is an extremely small amount, and empirically, it is known that, even if disturbance is repeatedly added, a total amount of an attenuation of the polarized amount is extremely small, and a cumulative effect also is small.

On the other hand, disturbance in accordance with the present invention is directly added to a cell capacitor, and an efficient amount of attenuation can be added.

Moreover, as shown in FIG. 3, the test mode in the present invention is specially effective in a case where remaining polarization is positioned at a place having large inclination on the hysteresis characteristic curve by an imprint. The imprint progresses, and when remaining polarization is positioned at the place having large inclination on the hysteresis characteristic curve, because the amount of depolarization is empirically made large, the need for the test mode increases all the more.

In the test sequence of the present invention shown in FIG. 1, it is known that, when polarization P of a positive value is written as the initial data in step (1), and baking is carried out in step (2), a hysteresis characteristic as shown in FIG. 3 is obtained by imprint. In this state, when writing of the opposite data pattern is carried out in step (4), the polarized amount as shown in FIG. 3 is provided.

As described above, because the attenuation of the polarized amount by depolarization is large, due to the test mode of the present invention being executed, it is specially effective for shortening a test time required for detecting an OS defect in FIG. 1.

Next, a schematic circuit structure of the ferroelectric memory relating to the respective embodiments of the invention will be described.

Figure 4:
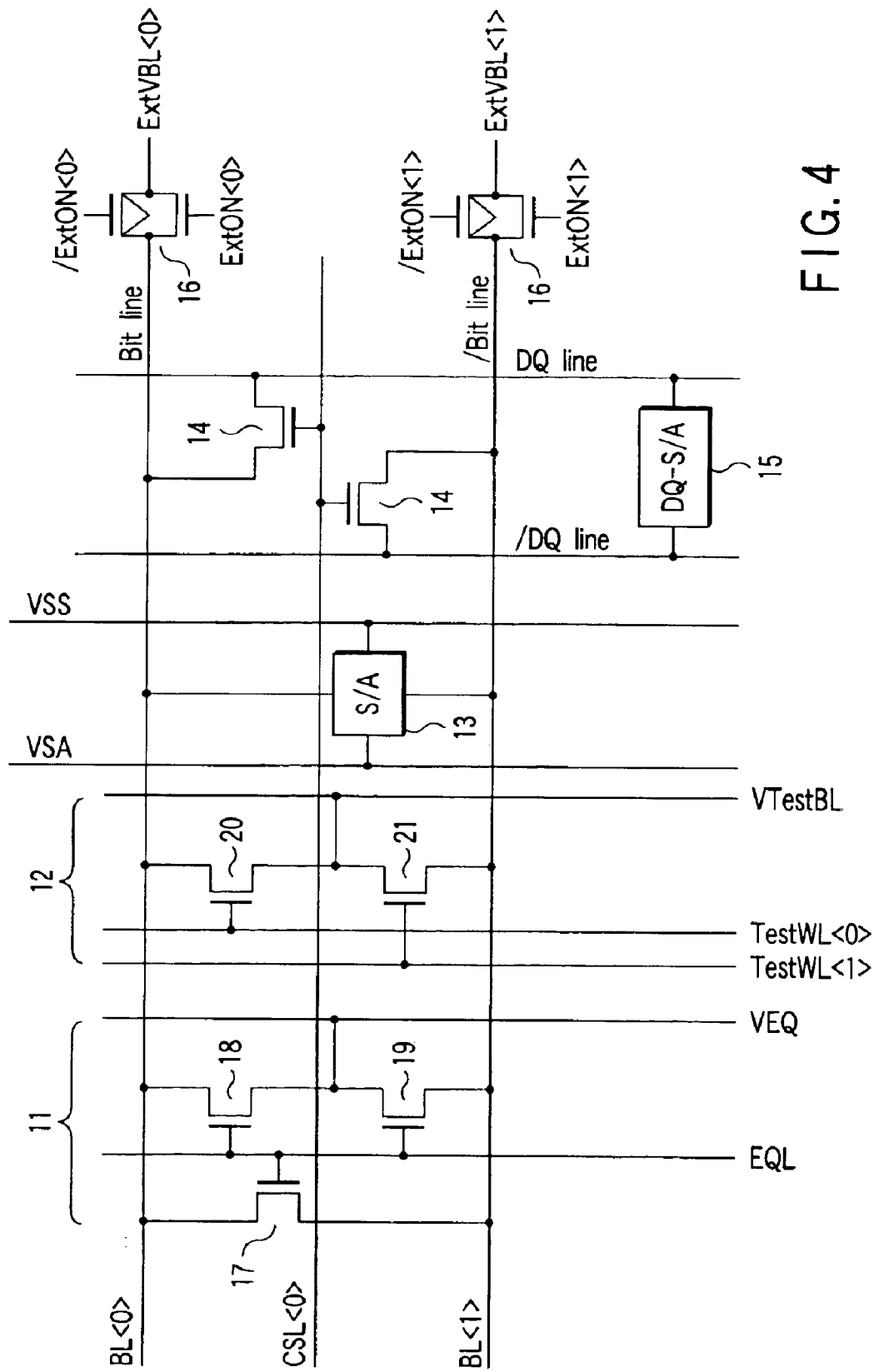
FIG. 4 is a circuit diagram showing a structure of a reading circuit in the ferroelectric memory applicable to the present invention.
Figure 6:
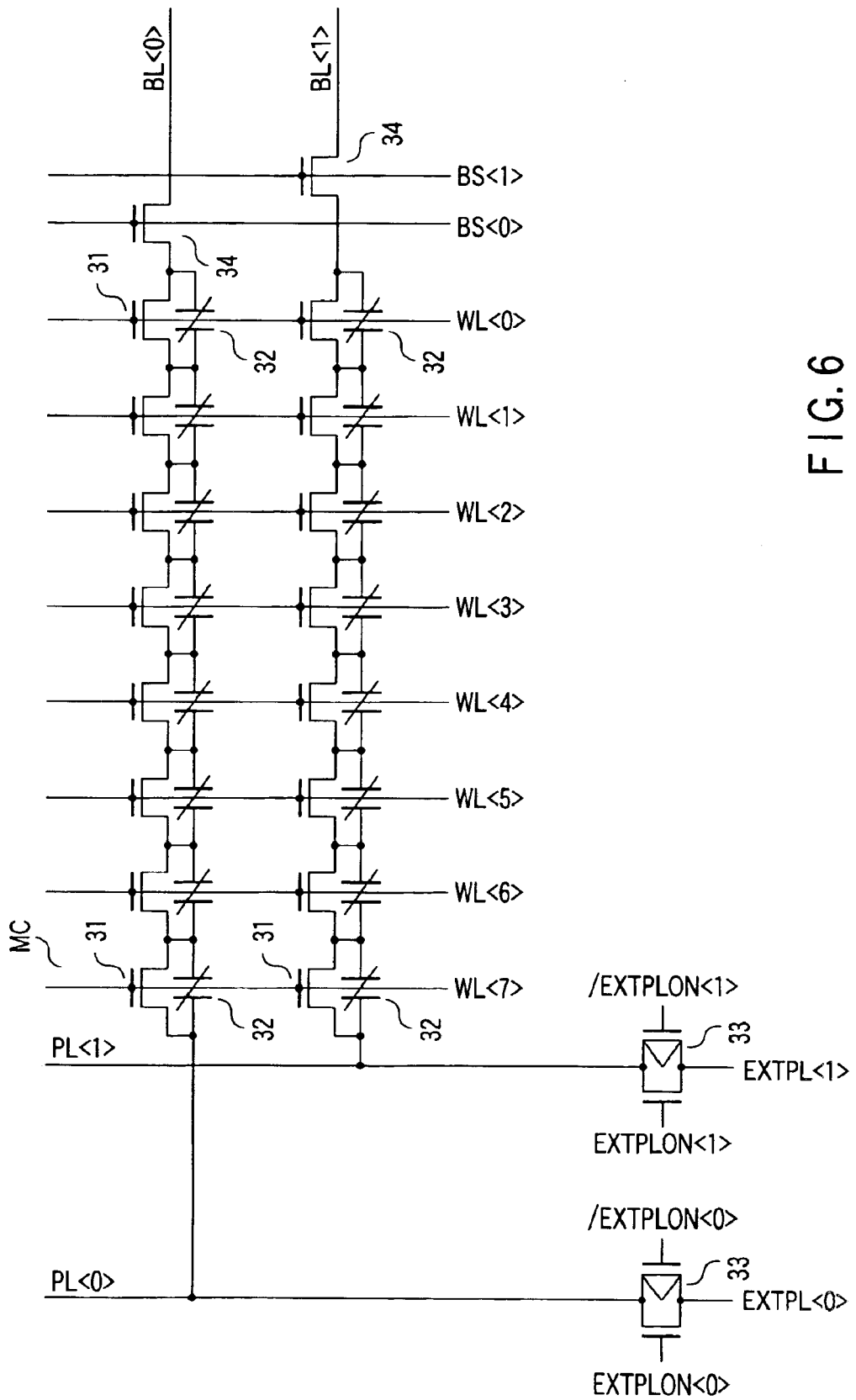
FIG. 6 is a circuit diagram showing a structure of a cell array different from that of FIG. 5 in the ferroelectric memory applicable to the present invention.

FIGS. 4, 5 and 6 show circuit diagrams of one portion of a reading circuit and one portion of a cell array in the ferroelectric memory. For example, the reading circuit shown in FIG. 4 and the cell array shown in FIG. 5 are used in combination therewith together, or the reading circuit shown in FIG. 4 and the cell array shown in FIG. 6 are used in combination therewith together.

The reading circuit shown in FIG. 4 includes a pair of bit lines BL<0> and BL<1>, a pair of data lines DQ and /DQ, a column selecting line CSL<0>, a bit line equalizing/pre-charging circuit 11, a bit line electric potential setting circuit 12 for setting a potential of the bit line to a testing potential VTestBL at the time of the test mode, a bit line sense amplifier (S/A) 13, a pair of column selecting transistors 14, a DQ sense amplifier (DQ-S/A) 15, and a pair of transfer gates 16 for transferring external electric potentials ExtVBL<0> and ExtVBL<1> to the pair of bit lines.

The bit line equalizing/pre-charging circuit 11 is formed of an NMOS transistor 17, an NMOS transistor 18 and an NMOS transistor 19. In the NMOS transistor 17, the source-drain path thereof is inserted between the pair of bit lines BL<0> and BL<1>, and an equalizing control line EQL is connected to the gate electrodes. In the NMOS transistor 18, the source-drain path thereof is inserted between the one bit line BL<0> and a supplying node of an equalizing electric potential VEQ, and the above-described equalizing control line EQL is connected to the gate electrode thereof. In the NMOS transistor 19, the source-drain path thereof is inserted between the other bit line BL<1> and the node of the equalizing electric potential VEQ, and the equalizing control line EQL is connected to the gate electrode thereof.

The bit line electric potential setting circuit 12 is formed of an NMOS transistor 20 and an NMOS transistor 21. In the NMOS transistor 20, the source-drain path thereof is inserted between a node to which a testing bit line electric potential VTestBL is supplied at the time of the test mode and the one bit line BL<0>, and the gate electrode thereof is connected to a testing word line TestWL<0> which is activated at the time of the test mode. In the NMOS transistor 21, the source-drain path thereof is inserted between a node of the testing bit line electric potential VTestBL and the other bit line BL<1>, and the gate electrode thereof is connected to a testing word line TestWL<1> which is activated at the time of the test mode.

The bit line sense amplifier 13 is connected between the pair of bit lines BL<0> and BL<1>, and amplifies an electric potential difference between the pair of bit lines BL<0> and BL<1> into an electric potential difference VSA or VSS.

The pair of column selecting transistors 14 are formed of NMOS transistors in which the source-drain paths are inserted between the pair of bit lines BL<0>, BL<1> and the pair of data lines DQ, /DQ, and the respective gate electrodes are commonly connected to the column selecting line CSL<0>.

The DQ sense amplifier 15 is connected between the pair of data lines DQ and /DQ, and amplifies an electric potential difference between the pair of data lines DQ and /DQ, and outputs the data. Further, the data generated from the DQ sense amplifier 15 is outputted to the exterior of the memory via a data input/output circuit.

The pair of transfer gates 16 are connected between the nodes of the bit line electric potentials ExtVBL<0>, ExtVBL<1> which are supplied from the exterior and the pair of bit lines BL<0>, BL<1>, and are constituted of PMOS and NMOS transistors in which the source-drain paths are respectively connected in parallel. The on/off states of the above-described pair of transfer gates 16 are controlled by control signals ExtON<0>, /ExtON<0> and ExtON<1>, and /ExtON<1>.

A plurality of memory cells are provided in a cell array in which only two cells MC are shown in FIG. 5. The each memory cell MC includes a cell transistor 31 which is formed of a MOS transistor and operates as a switch, and a cell capacitor 32 having a ferroelectric film of such as a PZT (PbZrTiO$_3$). One electrode of the capacitor 32 is connected to one end of the current path of the cell transistor 31. A plate line PL<0> or PL<1> is connected to the other electrode of each cell capacitor 32, and the bit line BL<0> or BL<1> is connected to the other end of the current path of each cell transistor 31. Further, the gate electrode of each cell transistor 31 is connected to the word line WL<0> or WL<1>.

Further, a pair of transfer gates 33 for transferring to the plate lines PL<0> and PL<1> plate line electric potentials EXTPL<0> and EXTPL<1> supplied from the exterior, are provided in the circuit of FIG. 5. The pair of transfer gates 33 are respectively formed of PMOS and NMOS transistors in which the source-drain paths are connected in parallel, and the on/off states are controlled by control signals EXTPLON<0>, /EXTPLON<0> and EXTPLON <1>, and /EXTPLON <1>.

Namely, each memory cell MC provided in the cell array of FIG. 5 is in the case of a so-called 1T-1C type memory cell including one MOS transistor and one capacitor.

A plurality of unit cells MC (memory cells) are provided in a cell array shown in FIG. 6. Each unit cell MC includes the cell transistor 31 and the cell capacitor 32 in the same way as in the case of FIG. 5. Due to the cell capacitors 32 of the plurality of unit cells being connected serially, and one side electrodes and the other side electrodes of the cell transistors 31 of the unit cells being connected to the corresponding cell capacitors 32 in parallel, the plurality of unit cells are connected in series, and two memory blocks are structured as shown in FIG. 6. Further, the plate line PL<0> for PL<1> is connected to one end of each memory block, and the bit line BL<0> or BL<1> is connected to the other end via one of block selecting NMOS transistors 34. The gate electrode of each cell transistor 31 is connected to the corresponding word line among the plurality of word lines WL<0> to WL<7>.

The gate electrode of the block selecting NMOS transistor 34 is connected to a block selecting line BS<0> or BS<1>.

Further, in the same way as in the circuit of FIG. 5, the pair of transfer gates 33 for transferring to the plate lines PL<0> and PL<1> plate line electric potentials EXTPL<0> and EXTPL<1> supplied from the exterior are provided.

Namely, the ferroelectric memory having a cell array such as that shown in FIG. 6 is the case of a TC parallel unit serially-connected type ferroelectric memory in which both ends of a capacitor (C) are respectively connected between the source and the drain of a cell transistor (T) in each unit cell, and the plurality of unit cells are connected in series.

Hereinafter, various embodiments of the present invention will be described in detail.

(First Embodiment)

Figure 7:
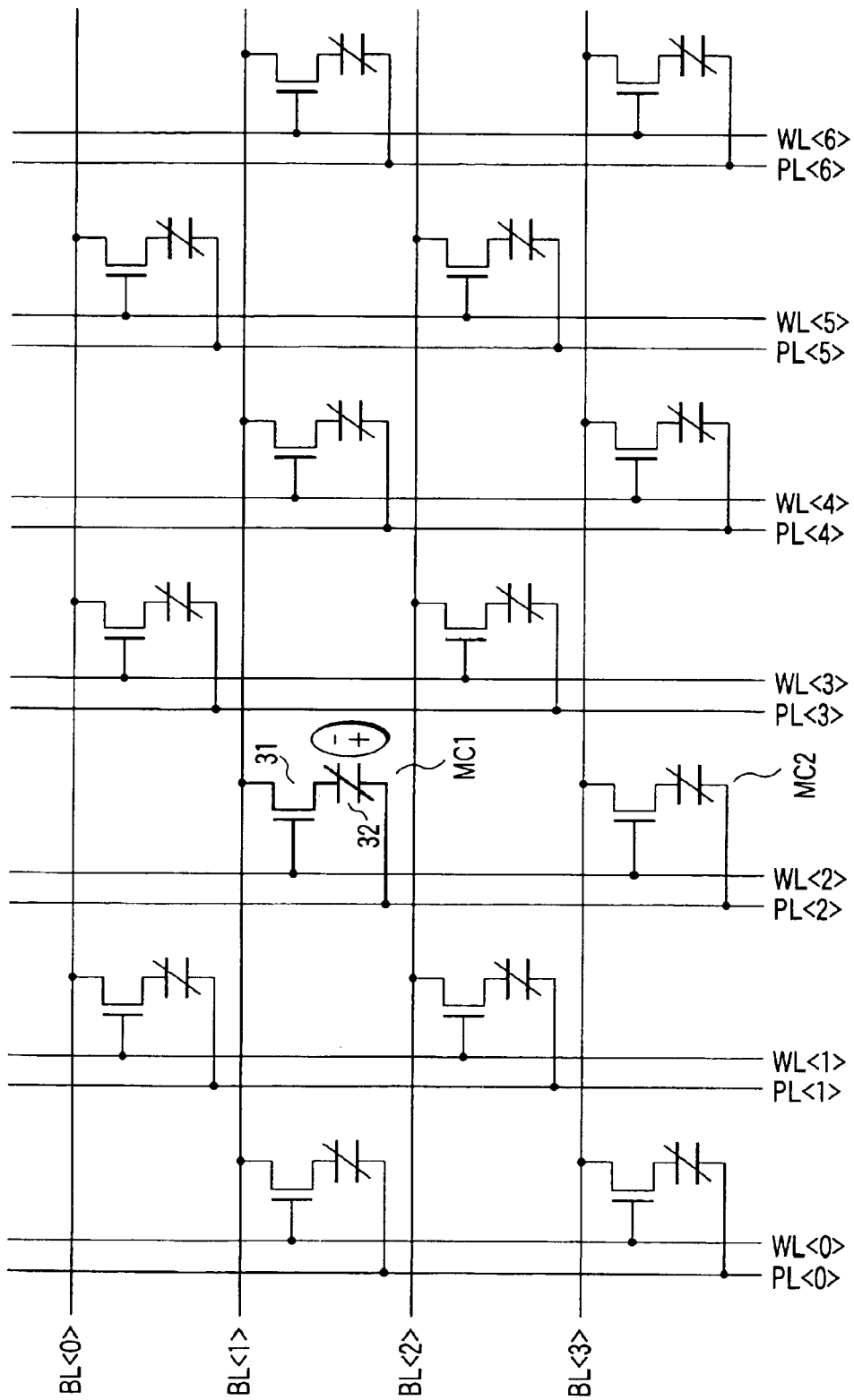
FIG. 7 is a circuit diagram showing a structure of a portion of a cell array of a ferroelectric memory according to a first embodiment of the present invention.

FIG. 7 shows partially a circuit structure of a cell array of 1T-1C type ferroelectric memory such as that shown in FIG. 5. A plurality of bit lines, plate lines, and word lines are respectively provided in FIG. 7, in which four bit lines BL<0> to BL<3>, seven plate lines PL<0> to PL<6>, and seven word lines WL<0> to WL<6> are exemplarily illustrated. In the respective row lines of the cell array, the respective memory cells are connected to every other bit lines, and the memory cells, whose respective gate electrodes are connected to the word lines WL<a> (a=0, 2, 4, 6, . . . ) on the even-numbered rows, are connected to the bit lines BL<b> (b=1, 3, . . . ) on the odd-numbered columns, and the memory cells, whose respective gate electrodes are connected to the word lines WL<c> (c=1, 3, 5, . . . ) on the odd-numbered rows, are connected to the bit lines BL<d> (d=0, 2, . . . ) on the even-numbered columns.

In a test mode, applying an electric potential difference smaller than the absolute value of the coercive voltage to the cell capacitor at the time of step (5) in the test sequence shown in FIG. 1 can be realized by applying a predetermined electric potential difference between the plate line and the bit line to which the memory cell is connected, and due to the cell transistor being made in a conductive state.

For example, in FIG. 7, the data "1" is written in advance into the one memory cell MC1 connected between the plate line PL<2> and the bit line BL<1>, and the operation at the time of applying an electric potential difference which is smaller than the absolute value of the coercive voltage before the data written in the memory cell MC1 is read, will be described with reference to a timing chart of FIGS. 8A to 8G.

First, the equalizing control line EQL is maintained at "H" as shown in FIG. 8A, and 0V is supplied as an equalizing electric potential VEQ. In accordance therewith, the NMOS transistors 17, 18, and 19 in the bit line equalizing/precharging circuit 11 shown in FIG. 4 are made conductive, and all of the bit lines including the bit lines BL<0>, BL<1> are equalized to 0V (GND) as shown in FIG. 8B.

Next, a row address Row Add.<2> corresponding to the word line WL<2> to which the memory cell MC1 is connected is selected, and the word line WL<2> is applied with a VPP voltage. In accordance therewith, the cell transistor in the memory cell MC1 is made to a conductive state, and electric potential 0V (GND) is applied to the electrode of the cell capacitor via the cell transistor in the memory cell MC1.

On the other hand, a control signal PLENBLE rises from 0V to "H" as shown in FIG. 8C, and preparation for driving the plate line is carried out. In accordance therewith, a control signal PLON once rises to "H" as shown in FIG. 8D, and an operation serving as the normal mode is prepared. Next, due to the control signal PLON once falling to "L", and the control signal /TestPL falling to "L" as shown in FIG. 8E, an operation serving as the test mode starts, and an electric potential VTestPL of a positive polarity is outputted to the plate line PL<2> as shown in FIG. 8G.

After a predetermined time after the control signal /TestPL shown in FIG. 8E falls to "L", the control signal /TestPL rises to "H". Then, an electric potential of the plate line PL<2> falls to 0V (GND). Further, after the control signal /TestPL rises to "H", an electric potential of the word line WL<2> falls to 0V (GND) as shown in FIG. 8F, and the operation for selecting the memory cell MC1 is completed. Next, the control signal PLON rises to "H" as shown in FIG.

8D, and a preparation for the normal mode operation starts. Thereafter, step (6) and steps thereafter in the test sequence shown in FIG. 1 are executed.

By the way, when the memory cell MC1 is selected when the bit line is set to electric potential 0V (GND) and the plate line PL<2> is set to electric potential VTestPL of a positive polarity respectively, as shown in FIG. 7, an electric potential difference VTestPL, which is such that the capacitor electrode at the plate line PL<2> side becomes (+) and the capacitor electrode at the cell transistor 31 side becomes (−), is applied to the cell capacitor 32 in the memory cell MC1. The electric potential difference VTestPL corresponds to the electric potential difference +ΔV smaller than the absolute value of the coercive voltage shown in FIG. 2A. Due to this electric potential difference being applied to the cell capacitor 32, and the electric potential of the plate line PL<2> being returned to 0V again, the polarized amount of the memory cell MC1 is a polarized amount which is equal to that after depolarization arises for a short time as shown in FIG. 2A. Accordingly, when reading data from the memory cell MC1 in the following step, the polarized amount can be evaluated in a short time.

When the data is read from the memory cell MC1, an electric potential difference larger than the above-described electric potential difference VTestPL is applied to the ferroelectric capacitor 32 in the memory cell MC1.

Note that, in the first embodiment, as shown in FIGS. 8E and 8F, the case has been described in which, after the control signal /TestPL rises to "H", the electric potential of the word line WL<2> falls to 0V (GND), and the operation for selecting the memory cell MC1 is once completed. However, as shown by the broken line in FIG. 8F, the electric potential of the word line WL<2> may be maintained at VPP electric potential while the control signal PLON is made to rise to "H" again even after the control signal /TestPL rises to "H", and reading of the data from the memory cell MC1 may be continuously carried out as the normal mode.

Further, the case is described in which, at the time of applying the electric potential VTestPL of a positive polarity to the plate line PL<2>, the electric potential VTestPL is continuously applied thereto as shown in FIG. 8G. However, a pulsed electric potential VTestPL may be applied for plural times consecutively. In this case, the electric potential difference VTestPL is applied plural times consecutively across the electrodes of the cell capacitor 32.

(Second Embodiment)

By the way, in the ferroelectric memory having the cell array having a structure such as that shown in FIG. 7, when the above-described electric potential difference VTestPL is applied to the selected memory cell MC1, this electric potential difference VTestPL is also applied to another memory cell existing at the same row, for example, to a memory cell MC2 connected between the plate line PL<2> and the bit line BL<3> as well, and disturbance is applied to the cell MC2.

Then, in a second embodiment of the invention, preventing of the application of a disturbance by the above-described electric potential difference VTestPL be not applied to the memory cells other than the selected memory cell has been considered.

Hereinafter, the operation will be described with reference to a timing chart of FIGS. 9A to 9H.

Figure 9A:
FIGS. 9A to 9H show, inclusively, a timing chart showing an example of the operation of a ferroelectric memory according to a second embodiment of the present invention.

When the equalizing control line EQL falls from "H" to "L" as shown in FIG. 9A, a state in which a bit line is equalized to 0V (GND) is cancelled. Next, an operation for selecting the memory cell MC1 is started. After the electric potential VTestPL of a positive polarity is outputted to the plate line PL<2>, the electric potential of the plate line PL<2> falls to 0V (GND) as shown in FIG. 9H.

Figure 9B:
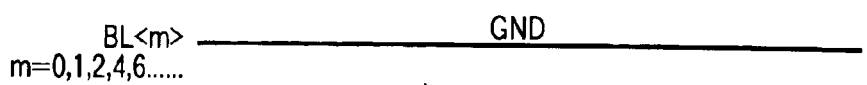
Figure 9C:
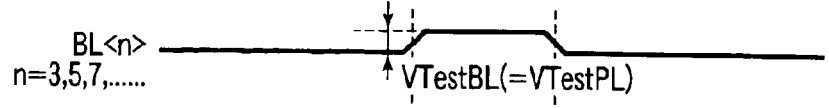
Figure 9D:
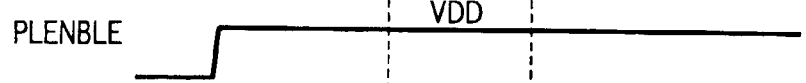
Figure 9E:
Figure 9F:
Figure 9G:
Figure 9H:
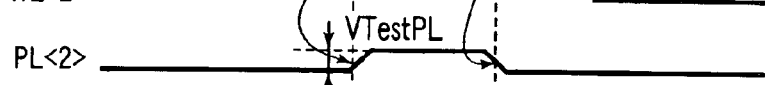

In this embodiment, as shown in FIG. 9C, the electric potential VTestBL (=VTestPL) of a positive polarity is outputted in parallel to a plurality of bit lines BL<n> (n=3, 5, 7, . . . ) other than the bit line to which the memory cell MC1 to be selected is connected and the bit lines at the even-numbered columns to which the memory cells are not connected, i.e., the bit lines BL<m> (m=0, 1, 2, 4, 6, . . . ) as shown in FIG. 9B, synchronously with the operation in which the output of the electric potential VTestPL of a positive polarity to the plate line PL<2> shown in FIG. 9H. The operation of outputting the electric potential VTestBL to the plurality of bit lines BL<n> is completed synchronously with the operation in which the output of the electric potential VTestPL to the plate line PL<2> is completed.

As a result, the above-described polarity electric potential VTestPL is not substantially applied to the memory cells such as the cell MC2 connected to the bit lines other than the selected bit line BL<1>, for example, to the bit line BL<3>, and the other unselected memory cells, and disturbance is not applied to the memory cell MC2, for example.

Note that, in the second embodiment as well, in the same way as in the first embodiment, as shown by the broken line in FIG. 9G, the electric potential of the word line WL<2> is maintained at VPP electric potential and the control signal PLON is made to rise to "H" again, so that reading of the data from the memory cell MC1 may be continuously carried out as the normal mode. Moreover, the case is described in which, when the electric potentials VTestPL and VTestBL of positive polarities are respectively applied to the plate line PL and the bit line, the electric potentials VTestPL and VTestBL are continuously applied. However, the electric potentials VTestPL and VTestBL may be applied in a pulse form plural times consecutively synchronously with each other. In this case, the electric potential difference VTestPL is applied plural times consecutively between both electrodes of the cell capacitor in the selected memory cell.

(Third Embodiment)

Figure 10:
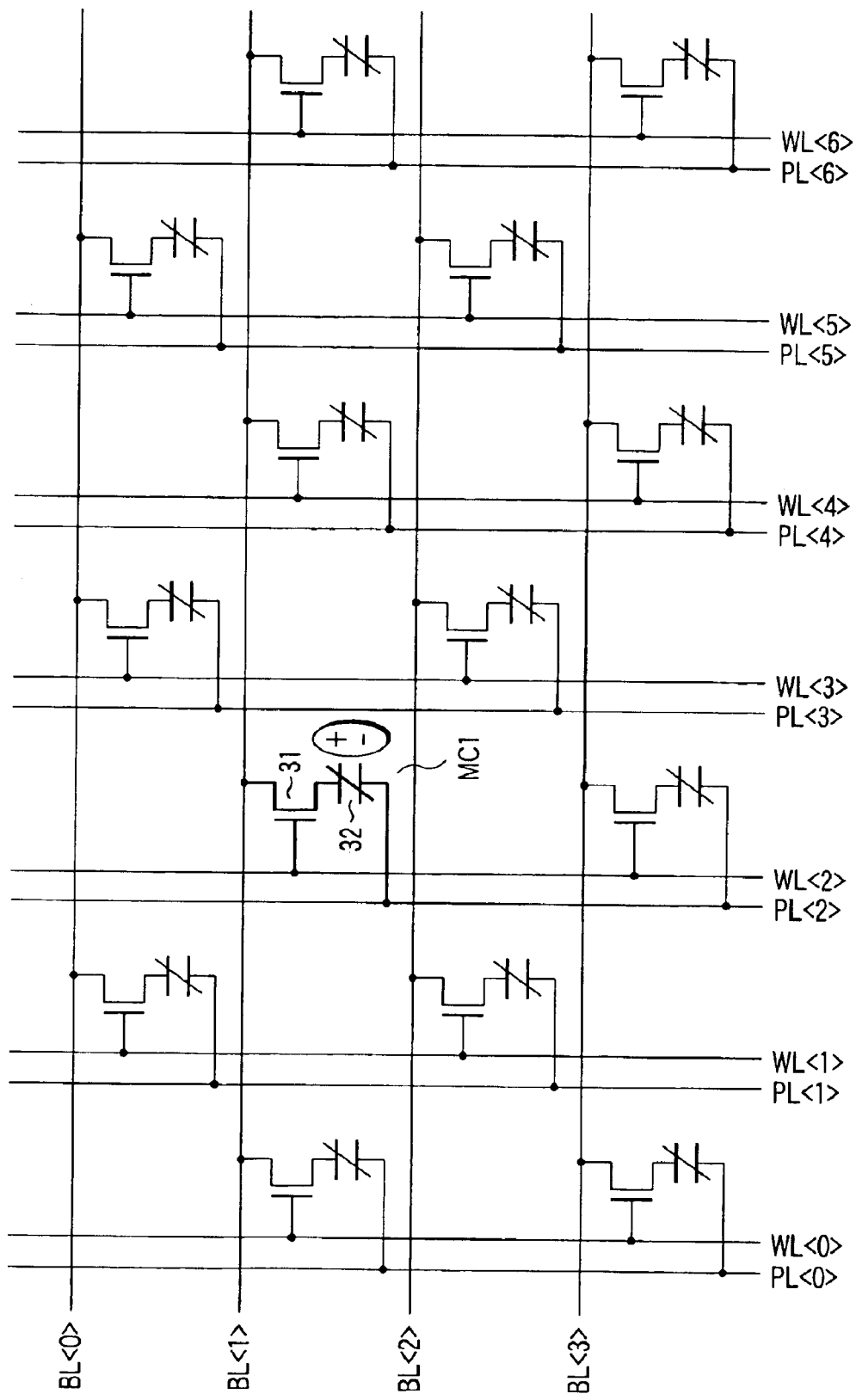
FIG. 10 is a circuit diagram showing a structure of a portion of a cell array of a ferroelectric memory according to a third embodiment of the present invention.

FIG. 10 shows a structure of a cell array of a ferroelectric memory according to a third embodiment of the invention. The cell array is structured in the same way as that of the first embodiment shown in FIG. 7.

In the respective first and second embodiments, the case is described in which an electric potential difference which causes the direction of the electric field directed from the plate line to the bit line so as to weaken polarization, and which is smaller than the absolute value of the coercive voltage, is applied to the memory cell. On the other hand, in the third embodiment, an electric potential difference which has the opposite direction of the electric field directed from the bit line to the plate line so as to weaken polarization, and which is smaller than the absolute value of the coercive voltage, is applied to the memory cell into which the "0" data is written in advance.

For example, the data "0" is written in advance into a memory cell MC1 at an even-numbered row connected to the word line WL<2>, the plate line PL<2> and the bit line BL<1>. The operation at the time of applying of an electric potential difference smaller than the absolute value of the coercive voltage before the data written in the memory cell MC1 is read out, will be described with reference to a timing chart of FIGS. 11A to 11E.

Figure 11A:
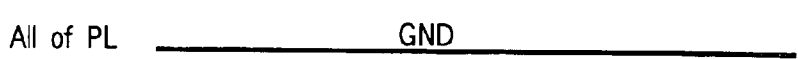
FIGS. 11A to 11E show, inclusively, a timing chart showing an example of the operation of the ferroelectric memory shown in FIG. 10.

All of the plate lines are equalized to 0V (GND) in advance as shown in FIG. 11A. Next, the row address Row Add.<2> corresponding to the word line WL<2> to which the memory cell MC1 is connected is selected, and the word line WL<2> is applied with a VPP voltage as shown in FIG. 11D, so that the operation for selecting the memory cell MC1 is started.

Figure 11B:
Figure 11C:
Figure 11D:
Figure 11E:
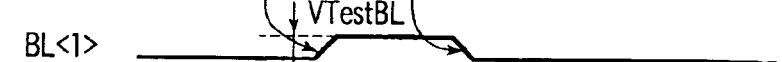

On the other hand, the control signal line EQL falls to "L" as shown in FIG. 11B, and thereafter, the control signal TestBL rises to "H" as shown in FIG. 11C. In this case, due to the column address Col Add.<1> corresponding to the bit line BL<1> being selected, the electric potential VTestBL of a positive polarity is outputted to the bit line BL<1> as shown in FIG. 11E. The control signal line EQL, the control signal TestBL, the electric potential VTestBL will be described later.

After a predetermined time after the control signal TestBL rises to "H", the control signal TestBL falls to "L", and the electric potential of the bit line BL<1> falls to 0V (GND) as shown in FIGS. 11C and 11E. Further, after the control signal TestBL falls to "L", the electric potential of the word line WL<2> falls to 0V (GND) as shown in FIG. 11D, and the operation for selecting the memory cell MC1 is completed. Thereafter, step (6) and steps thereafter in the test sequence shown in FIG. 1 are executed.

In this case, the electric potential of the bit line BL<1> to which the memory cell MC1 is connected rises from 0V (GND) to the electric potential VTestBL of a positive polarity as shown in FIG. 11E. Because all of the plate lines are equalized to 0V (GND) as shown in FIG. 11A, an electric potential difference VTestBL, which is such that the electrode at the plate line PL<2> side becomes (−) and the capacitor electrode at the cell transistor 31 side becomes (+), is applied to the cell capacitor 32 in the selected memory cell MC1, as shown in FIG. 10. Due to such an electric potential difference being applied to the cell capacitor 32, the polarized amount of the memory cell MC1 becomes a polarized amount which is equal to that after depolarization arises for a short time. Accordingly, when reading the data from the memory cell MC1 in the following step, the polarized amount can be evaluated in a short time.

Note that, in the third embodiment, the case is described in which, after the control signal TestBL falls to "L", the electric potential of the word line WL<2> falls to 0V (GND), and the operation for selecting the memory cell MC1 is completed. However, as shown by the broken line in FIGS. 11B and 11D, the data may be continuously read from the memory cell MC1 while maintaining the electric potential of the word line WL<2> at VPP even after the control signal TestBL falls to "L".

In addition, the case is described in which, when the electric potential VTestBL of a positive polarity is applied to the bit line BL<1>, the electric potential VTestBL is continuously applied for a predetermined period of time. However, the electric potential VTestBL may be applied in a pulse form plural times consecutively. In this case, the electric potential difference VTestBL is applied plural times consecutively between both electrodes of the cell capacitor 32 of FIG. 10.

(Fourth Embodiment)

Figure 12:
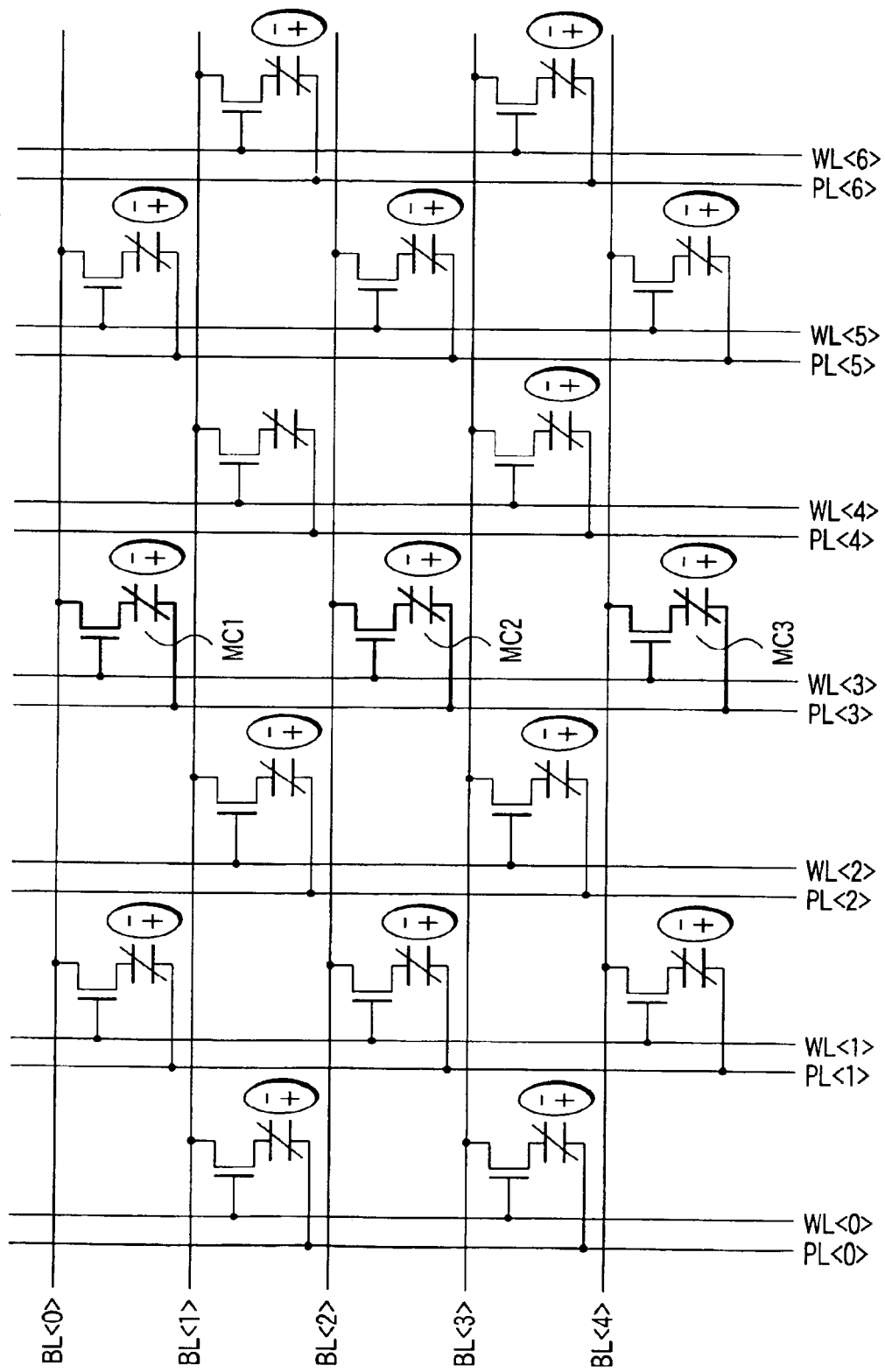
FIG. 12 is a circuit diagram showing a structure of a portion of a cell array of a ferroelectric memory according to a fourth embodiment of the present invention.

FIG. 12 shows a structure of a cell array of a ferroelectric memory according to a fourth embodiment of the invention. The cell array is structured in the same way as that of the first embodiment shown in FIG. 7.

In the respective first to third embodiments, the case is described in which an electric potential difference smaller than the absolute value of the coercive voltage is applied to the memory cell before the data is read from a selected memory cell into which the data "1" or "0" is written. On the other hand, in the fourth embodiment, the data "1" is first written into all of the memory cells in the cell array, and an electric potential differences which have the direction of the electric field directed from the plate line to the bit line so as to weaken the polarization, and which are smaller than the absolute value of the coercive voltage, are applied to these memory cells.

Next, the operation of the memory shown in FIG. 12 will be described with reference to a timing chart of FIGS. 13A to 13I.

A control signal PLENBLE rises from "L" to "H" (VDD) and a preparation for driving the plate line is carried out as shown in FIG. 13B. After the control signal PLENBLE rises to "H", the control signal PLON once rises to "H" in order to drive the plate line as shown in FIG. 13D. Because the equalizing control line EQL is set to "H" (VDD) as shown in FIG. 13A, NMOS transistors 17, 18, and 19 in the bit line equalizing/pre-charging circuit 11 shown in FIG. 4 are turned on, and all of the bit lines are equalized to 0V (GND) as shown in FIG. 13C.

Next, the control signal PLON falls to "L", and the control signal /TestPL falls to "L" as shown in FIGS. 13D and 13E. Further, due to row addresses being switched, the plurality of word lines are selected in order from the word line WL<0>, and the selected word line is raised to the VPP voltage. Due to the row address <0> being selected and the control signal /TestPL falling to "L", the electric potential VTestPL of a positive polarity is outputted to the plate line PL<0>, as shown in FIG. 13G.

After a predetermined time after the control signal /TestPL falls to "L", as the control signal /TestPL rises to "H", the electric potential of the plate line PL<0> falls to 0V (GND) as shown in FIGS. 13E and 13G. After the control signal /TestPL rises to "H", the electric potential of the word line WL<0> falls to 0V (GND) as shown in FIG. 13F, and the control signal PLON further rises to "H" as shown in FIG. 13D. In this way, the first operation for selecting the row<0> is carried out. Because, when the word line WL<0> has been selected, the electric potential of the plate line PL<0> at the corresponding row varies from 0V→VTestPL→0V, and as shown in FIG. 12, an electric potential difference VTestPL, which is such that the plate line PL<0> side becomes (+) and the cell transistor side becomes (−), is applied in parallel to all of the memory cells connected to the word line WL<0> and the plate line PL<0>. This electric potential difference VTestPL corresponds to the electric potential difference ΔV which is described in FIG. 2A and which is smaller than the absolute value of the coercive voltage. The electric potential difference is applied to the cell capacitors of the memory cells of one row, and due to the electric potential of the plate line being returned to 0V, the polarized amounts of these respective memory cells become polarized amounts which are equal to that after depolarization arises for a short time as shown in FIG. 2A.

Hereinafter, in the same way, the electric potential of the plate line at the corresponding row varies from 0V→VTestPL→0V when a word line at a different row has been selected, and as shown in FIG. 12, an electric potential difference VTestPL, which is such that the plate line PL<0> side becomes (+) and the cell transistor side becomes (−), is applied in parallel to all of the memory cells in the corresponding row.

Accordingly, after the above-described electric potential difference VTestPL is applied, when the data from the respective memory cells are read, the respective polarized amounts can be evaluated in a short time.

Note that, in the case of the present embodiment as well, in the same way as in the cases of the respective first to third embodiments, when the electric potential VTestPL of a positive polarity is applied to the respective plate lines, due to the electric potential VTestPL being applied in a pulse form plural times consecutively, the electric potential VTestPL may be applied plural times consecutively between both electrodes of the respective cell capacitors.

(Fifth Embodiment)

In the above-described fourth embodiment, when all of the memory cells in the cell array are selected, and the electric potential VTestPL is applied to the respective plate lines, the plurality of word lines and plate lines are successively selected while switching the row address.

On the other hand, in a fifth embodiment of the invention, the plurality of word lines and plate lines are simultaneously selected.

Hereinafter, the operation will be described with reference to a timing chart of FIGS. 14A to 14G. In this case, because the control signal line EQL is fixed to "H" (VDD) as shown in FIG. 14A, all of the bit lines are equalized to 0V (GND) as shown in FIG. 14B. The control signal PLENBLE rises from "L" to "H" (VDD) as shown in FIG. 14C, and a preparation for driving the plate line is carried out. The control signal PLENBLE is held at "H", and a preparation for driving the plate line serving as the normal mode is once carried out.

Next, the control signal PLON shown in FIG. 14D falls to "L", and thereafter, due to the control signal /TestPL shown in FIG. 14E falling to "L", the plate line serving as the test mode is driven, and due to all of the row addresses being selected, the electric potential VTestPL of a positive polarity are simultaneously outputted to all of the plate lines PL<n> as shown in FIG. 14G. Further, all of the word lines WL<n> (n=0, 1, 2, 3 . . . ) are supplied with the voltage VPP.

Next, after a predetermined time after the control signal /TestPL falls to "L", the control signal /TestPL rises to "H", the electric potentials of all of the plate lines PL<n> simultaneously fall to 0V (GND) as shown in FIGS. 14E and 14G. After the control signal /TestPL rises to "H", the selections of all of the row addresses are cancelled, and the electric potentials of all of the word lines WL<n> shown in FIG. 14F fall to 0V (GND), and thereafter, the control signal PLON rises to "H" as shown in FIG. 14D.

In this way, all of the word lines are simultaneously selected, and the electric potentials of all of the plate lines vary from 0V→VTestPL→0V. As a result, as shown in FIG. 12, an electric potential differences VTestPL, which is such that the plate line side becomes (+) and the cell transistor side becomes (−), is applied in parallel to all of the memory cells. Due to this electric potential difference being applied to the cell capacitors of the respective memory cells, the polarized amounts of these respective memory cells respectively become polarized amounts which are equal to that after depolarization arises for a short time as shown in FIG. 2A.

In the fifth embodiment, because the plurality of word lines and plate lines are simultaneously selected, an attempt can be made to shorten the test time even more.

Note that, in the case of the present embodiment as well, in the same way as in the cases of the respective first to fourth embodiments, when the electric potential VTestPL of a positive polarity is applied to the respective plate lines, due to the electric potential VTestPL being applied in a pulse form plural times consecutively, the electric potential VTestPL may be applied plural times consecutively between both electrodes of the respective cell capacitors.

(Sixth Embodiment)

Figure 15:
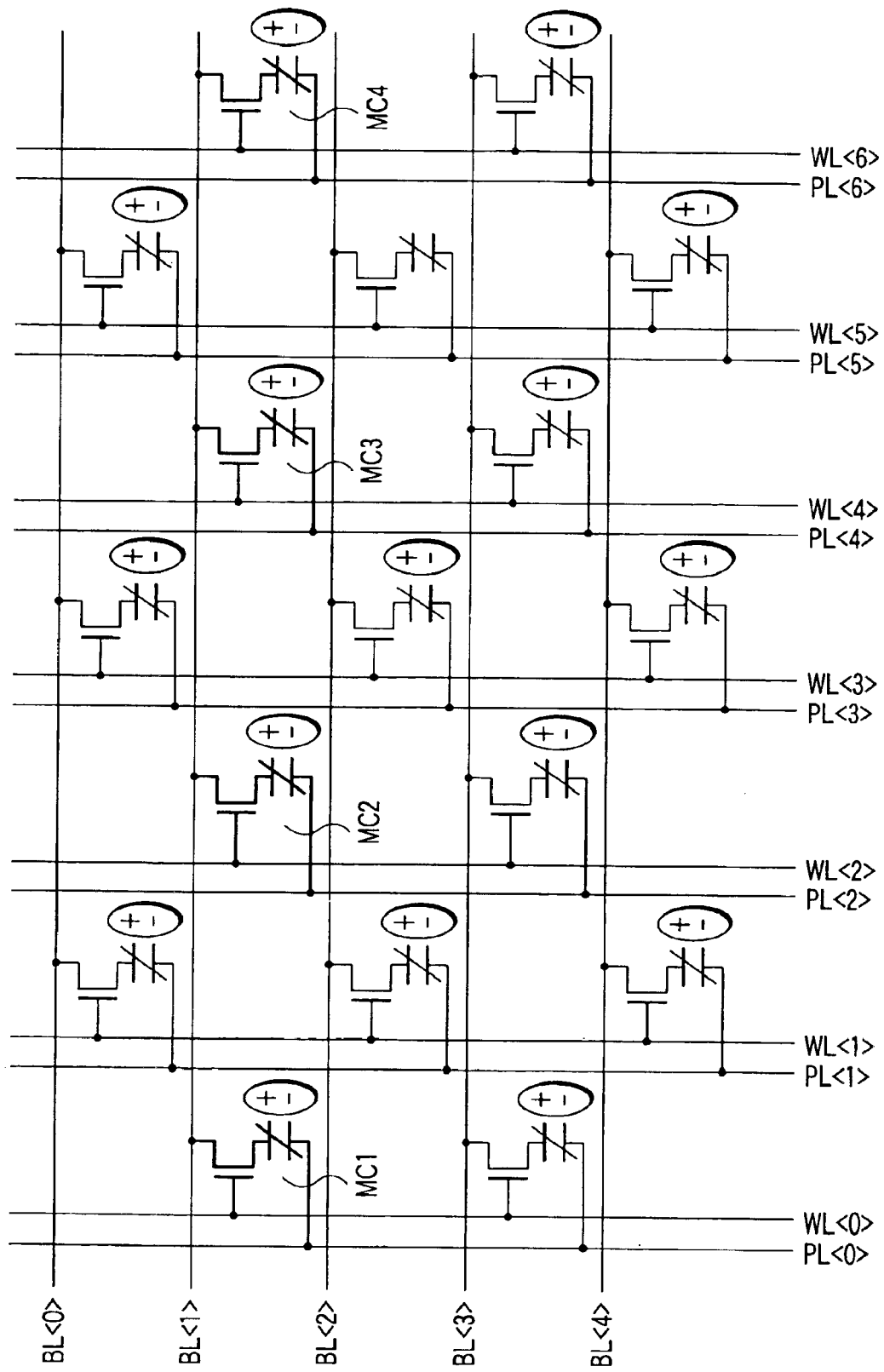
FIG. 15 is a circuit diagram showing a structure of a portion of a cell array of a ferroelectric memory according to a sixth embodiment of the present invention.

FIG. 15 shows a structure of a cell array of a ferroelectric memory according to a sixth embodiment of the invention. The cell array is structured in the same way as that of the first embodiment shown in FIG. 7.

In the respective fourth and fifth embodiments, the data "1" is written into all of the memory cells in advance, and electric potential difference which has an electric field directed from the plate line to the bit line, and which is smaller than the absolute value of the coercive voltage, is applied to these memory cells.

On the other hand, in the sixth embodiment, the data "0" is written into all of the memory cells, and an electric potential difference which has electric fields directed from the bit line to the plate line, and which is smaller than the absolute value of the coercive voltage, is applied to these memory cells.

Next, the operation will be described with reference to a timing chart of FIGS. 16A to 16E.

In this case, all of the plate lines are equalized to 0V (GND) in advance as shown in FIG. 16A.

Due to the column addresses being switched, the plurality of bit lines are selected, and the electric potential is applied to the selected bit lines so as to be varied from 0V→VTestBL→0V.

When the bit lines BL<n> at the odd numbered columns are selected, the word line WL<1> at the even numbered row is selected, and the electric potential VPP is applied to the word line WL<1> as shown in FIGS. 16B and 16C, and when the bit line BL<n+1> at the even numbered columns is selected, the word line WL<1+1> at the add numbered row is selected as shown in FIGS. 16D and 16E, and the electric potential thereof is raised to VPP.

For example, when the bit line BL<1> at the odd numbered column is selected, all of the word lines WL<0>, WL<2>, WL<4>, and WL<6> at the even numbered lines are selected, and as shown in FIG. 15, an electric potential difference VTestBL, which is such that the plate line side becomes (−) and the cell transistor side becomes (+), is respectively applied to the respective memory cells MC1, MC2, MC3, and MC4 disposed at the respective intersections.

Due to the electric potential difference VTestBL being applied to the respective memory cells, the polarized amounts of these respective memory cells respectively become polarized amounts which are equal to that after depolarization arises for a short time. Accordingly, when readings of the data from the respective memory cells is carried out after the above-described electric potential difference VTestBL is applied, the respective polarized amounts can be evaluated in a short time.

Note that, in the case of the present embodiment as well, in the same way as in the cases of the respective first to fifth embodiments, when the electric potential VTestBL of a positive polarity is applied to the respective bit lines, due to the electric potential VTestBL being applied in a pulse form plural times consecutively, the electric potential VTestBL may be applied plural times consecutively between both electrodes of the respective cell capacitors.

(Seventh Embodiment)

In the sixth embodiment, when all of the memory cells in the cell array are selected, and the electric potential VTestBL is applied to the respective bit lines, the plurality of word lines and plate lines are successively selected while switching the row address and the column address.

On the contrary, in a seventh embodiment of the invention, all of the word lines and plate lines are simultaneously selected.

Hereinafter, the operation will be described with reference to a timing chart of FIGS. 17A to 17E.

In the same way as in the sixth embodiment, all of the plate lines are equalized to 0V (GND) in advance as shown in FIG. 17A. Further, all of the row addresses are made to be in the selection states. In accordance therewith, all of the word lines WL<x> are applied with the voltage VPP as shown in FIG. 17D.

On the other hand, the control signal line EQL shown in FIG. 17B falls to "L", and thereafter, due to the control signal TestBL rising to "H" as shown in FIG. 17C, the electric potential VTestBL of a positive polarity is simultaneously outputted to all of the plate lines BL<x> as shown in FIG. 17E.

After a predetermined time after the control signal TestBL rises to "H", the control signal TestBL falls to "L", and the electric potentials of all of the bit lines BL<x> simultaneously fall to 0V (GND). Further, all of the word lines WL<x> fall to 0V (GND) after the control signal TestBL falls to "L". Moreover, the control signal line EQL rises to "H" as shown in FIG. 17B.

In this way, all of the word lines WL<x> are simultaneously selected, and when all of the word lines WL<x> have been selected, the electric potentials of all of the bit lines BL<x> vary from 0V→VTestBL→0V. As a result, as shown in FIG. 15, an electric potential difference VTestBL, which is such that the plate line side becomes (−) and the cell transistor side becomes (+), is applied to all of the memory cells including, for example, the memory cells MC1 to MC4 connected to the bit line BL<1>. Due to this electric potential difference being applied to the cell capacitors of the respective memory cells, the polarized amounts of these respective memory cells respectively become polarized amounts which are equal to that after depolarization arises for a short time.

In the seventh embodiment, because all of the word lines and plate lines are simultaneously selected, an attempt can be made to shorten the test time even more.

Note that, in the case of the present embodiment as well, in the same way as in the cases of the respective first to sixth embodiments, when the electric potential VTestBL is applied to the respective bit lines, due to the electric potential VTestBL being applied in a pulse form plural times consecutively, the electric potential difference VTestBL may be applied plural times consecutively between both electrodes of the respective cell capacitors.

(Eighth Embodiment)

By the way, when a test on the ferroelectric memory is carried out, there are cases in which a so-called checker pattern in which the data "1", "0" are stored in cells arranged in a checker form in a memory array. In an eighth embodiment of the invention, in the ferroelectric memory in which such a checker-patterned data are written, an electric potential difference smaller than the absolute value of the coercive voltage is applied to the memory cells in which the data "1" is written.

Figure 18:
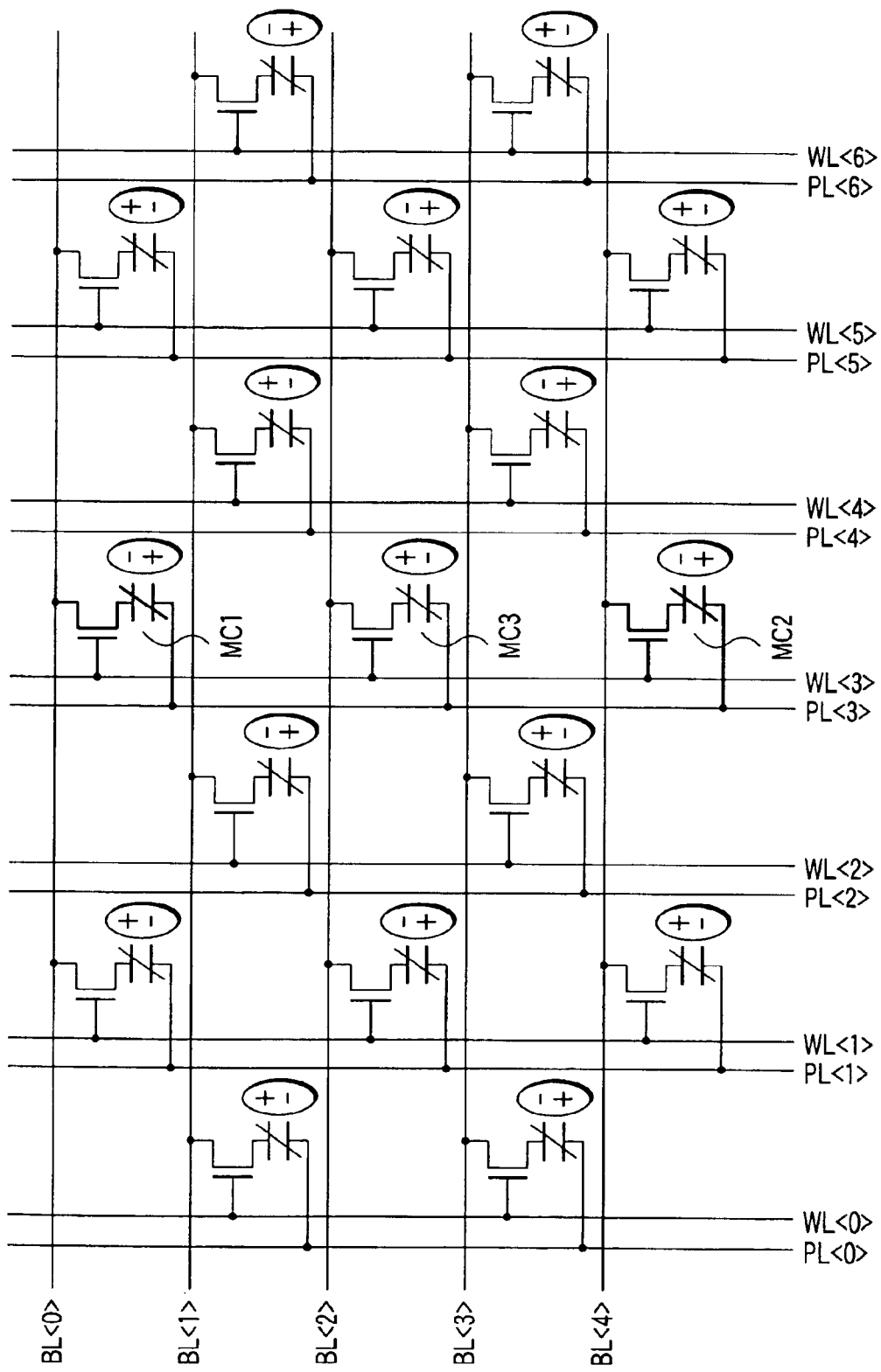
FIG. 18 is a circuit diagram showing a structure of a portion of a cell array of a ferroelectric memory according to an eighth embodiment of the present invention.
Figure 19:
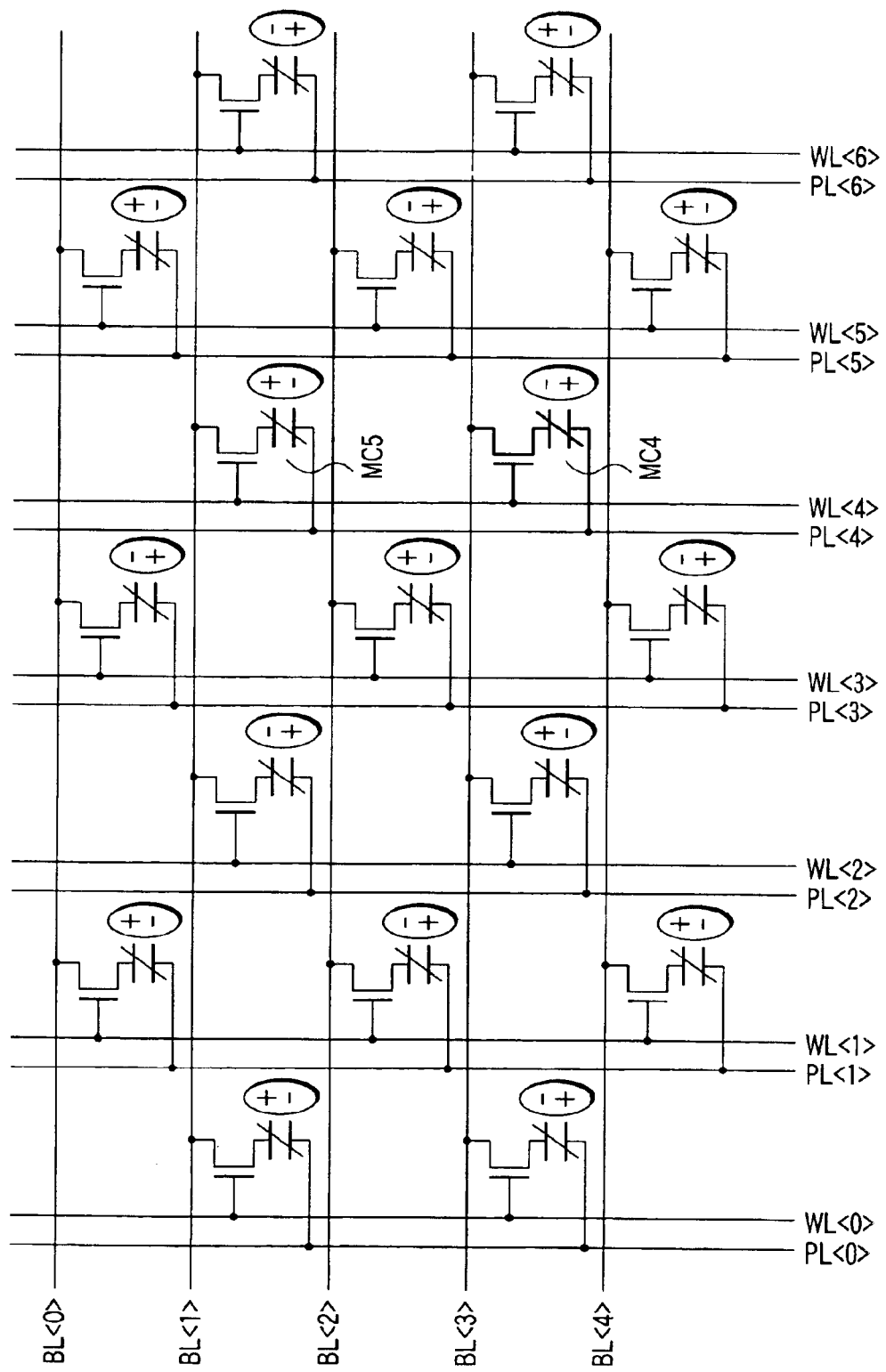
FIG. 19 is a circuit diagram showing a structure of another portion of a cell array of the ferroelectric memory according to the eighth embodiment of the present invention.

For example, as shown in FIG. 18, it is supposed that, among the plurality of memory cells connected to the word line WL<3>, the data "1" is written into the memory cells MC1 and MC2 connected to the bit lines BL<0> and BL<4>, and the data "0" is written into the memory cell MC3 connected to the bit line BL<2>. As shown in FIG. 19, it is supposed that, among the plurality of memory cells connected to the word line WL<4>, the data "1" is written into the memory cell MC4 connected to the bit line BL<3>, and the data "0" is written into the memory cell MC5 connected to the bit line BL<1>.

Hereinafter, the operation will be described with reference to a timing chart of FIGS. 20A to 20K.

Figure 20:
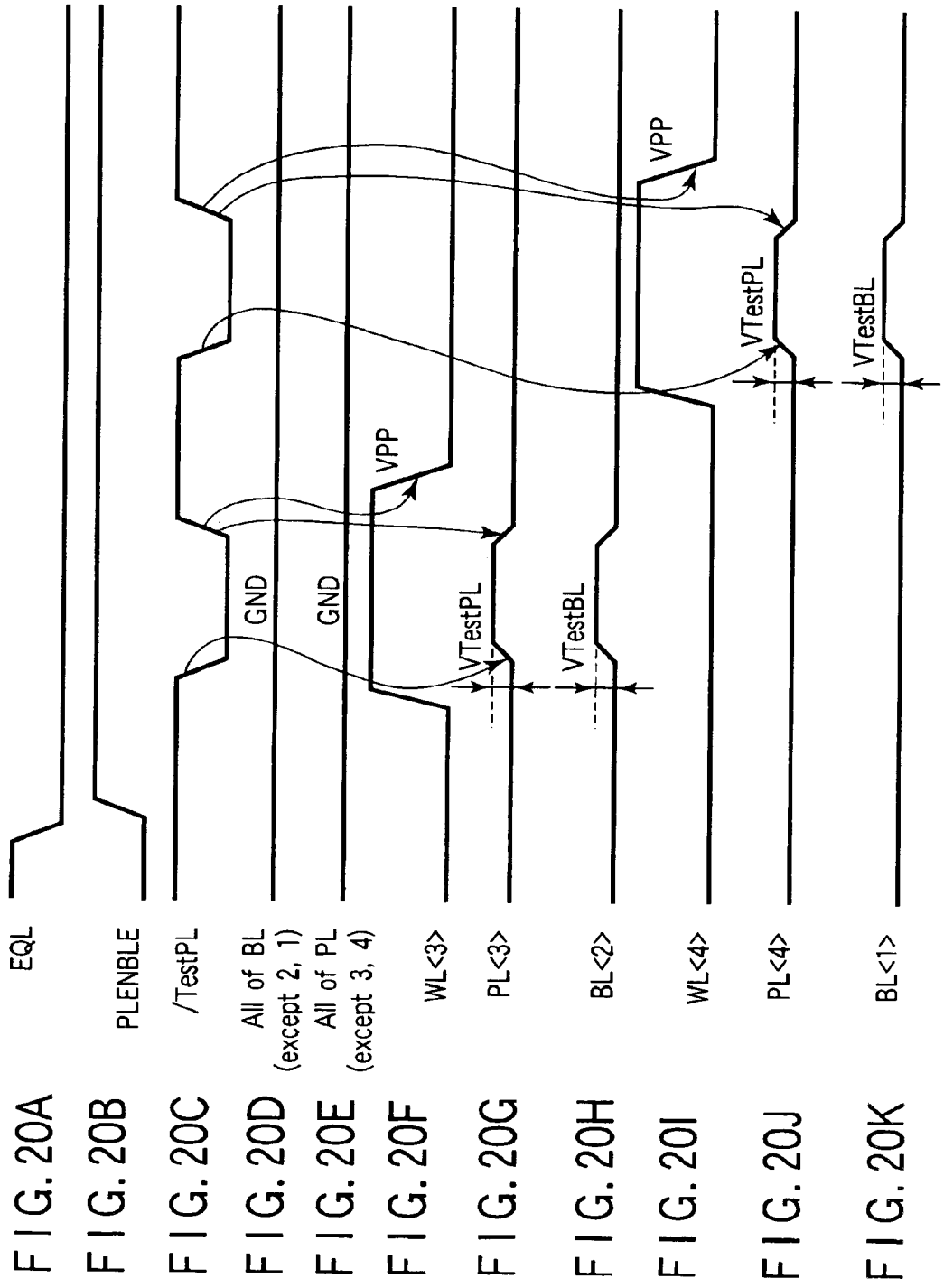
FIGS. 20A to 20K show, inclusively, a timing chart showing an example of the operation of the ferroelectric memory shown in FIGS. 18 and 19.

As shown in FIG. 20A, all of the bit lines and plate lines are respectively equalized to 0V (GND) in advance by the signal EQL. Then, row addresses are successively selected. For example, a row address Row. Add.<3> is selected, and when an electric potential of the corresponding word line WL<3> has been raised to VPP as shown in FIG. 20F, the plate line PL<3> varies from 0V→VTestPL→0V synchronously with the control signal /TestPL as shown in FIGS. 20C and 20G. In accordance therewith, an electric potential difference VTestPL, which is such that the plate line PL<3> side becomes (+) and the cell transistor side becomes (−), is applied in parallel to the memory cells MC1 and MC2 which are shown in FIG. 18 and in which the data "1" are respectively written. This electric potential difference VTestPL corresponds to the electric potential difference which is described in FIG. 2A, and which is smaller than the absolute value of the coercive voltage. Due to the electric potential difference being applied to the respective cell capacitors of the memory cells MC1 and MC 2, the polarized amounts of these memory cells respectively become polarized amounts which are equal to that after depolarization arises for a short time.

On the other hand, during the word line WL<3> has been selected, a disturbance such as that described above is applied to the memory cell MC3 which is connected to the selected word line WL<3> and into which the data "0" is written. In order to prevent such a disturbance, as shown in FIGS. 20G and 20H, synchronously with making the electric potential of the plate line PL<3> vary from 0V→VTestPL→0V, the electric potential of the bit line BL<2> is made to vary from 0V→VTestBL (=VTestPL) →0V. Accordingly, the electric potential difference is not substantially applied between the plate line PL<3> and the bit line BL<2> to which the memory cell MC3 shown in FIG. 18 is connected, and a disturbance is not applied to the memory cell MC3.

Next, for example, a row address Row. Add.<4> is selected, and the electric potential of the corresponding word line WL<4> has been raised to VPP, the plate line PL<4> varies from 0V→VTestPL→0V synchronously with the control signal /TestPL as shown in FIGS. 20C, 20I and 20J. In accordance therewith, an electric potential difference VTestPL, which is such that the plate line PL<4> side becomes (+) and the cell transistor side becomes (−), is applied in parallel to the memory cell MC4 which is shown in FIG. 19 and into which the data "1" is written. This electric potential difference VTestPL corresponds to the electric potential difference smaller than the absolute value of the coercive voltage described in FIG. 2A. Due to the electric potential difference being applied to the cell capacitor of the memory cell MC4, the polarized amount of the memory cell MC4 becomes a polarized amount which is equal to that after depolarization arises for a short time.

On the other hand, when the word line WL<4> has been selected, with respect to a memory cell MC5 which is connected to the word line WL<4> and into which the data "0" is written. As shown in FIGS. 20J and 20K, synchronously with making the electric potential of the plate line PL<4> vary from 0V→VTestPL→0V, the electric potential of the bit line BL<1> is made to vary from 0V→VtestBL→0V. Therefore, in the same way as in the above-described case of PL<3> and BL<2>, a disturbance is not applied to the memory cell MC5.

Note that, in the case of the present embodiment as well, in the same way as in the cases of the respective first to seventh embodiments, when the electric potential VTestPL is applied to the respective plate lines, due to the electric potential VTestPL being applied in a pulse form plural times consecutively, the electric potential difference VTestPL may be applied plural times consecutively between both electrodes of the respective cell capacitors.

(Ninth Embodiment)

In a ninth embodiment of the invention, in the above-described ferroelectric memory into which the data items are written in the checker-pattern like, an electric potential difference smaller than the absolute value of the coercive voltage is applied to the memory cell into which the data "0" is written.

Figure 21:
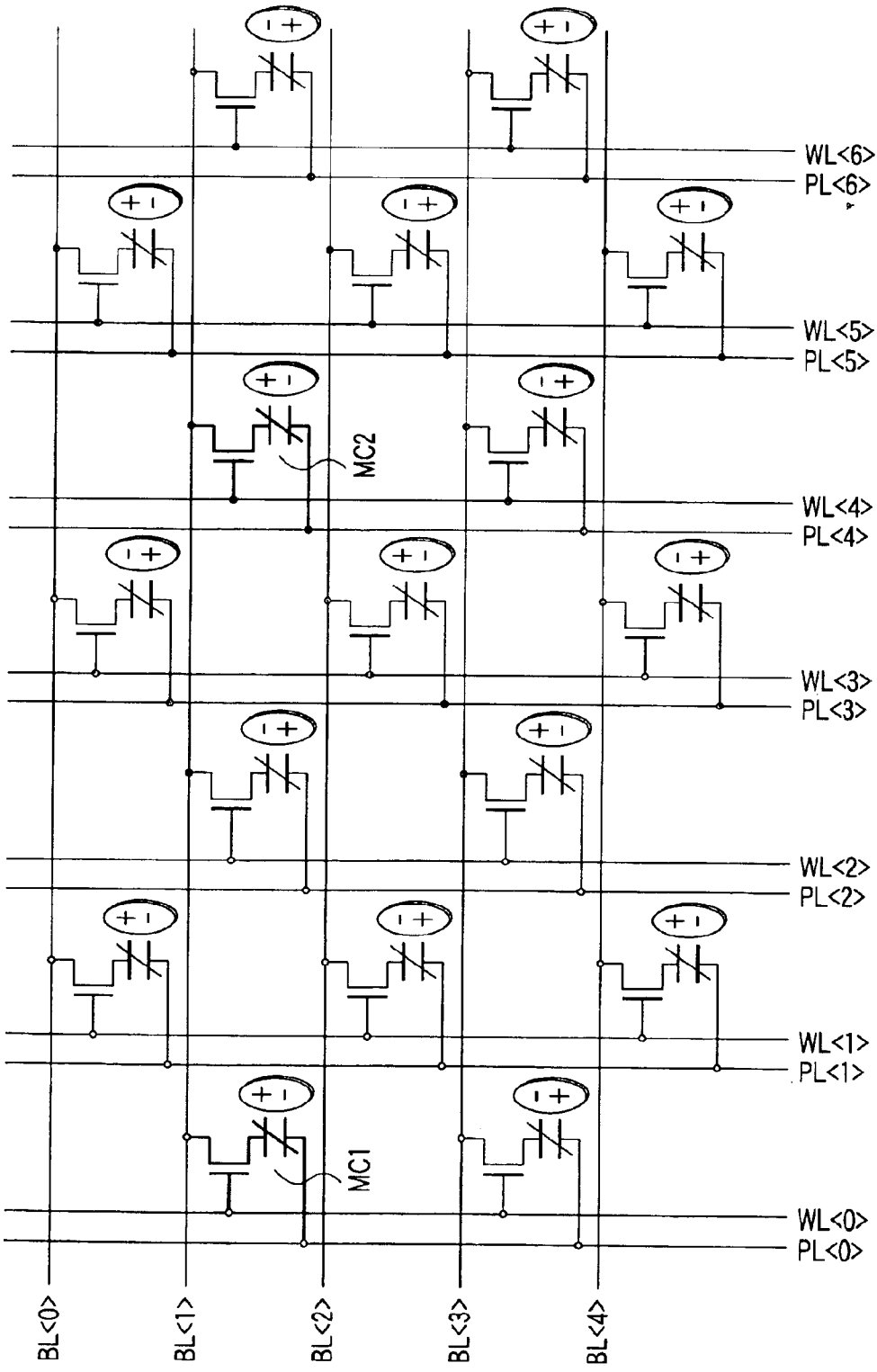
FIG. 21 is a circuit diagram showing a structure of a portion of a cell array of a ferroelectric memory according to a ninth embodiment of the present invention.
Figure 22:
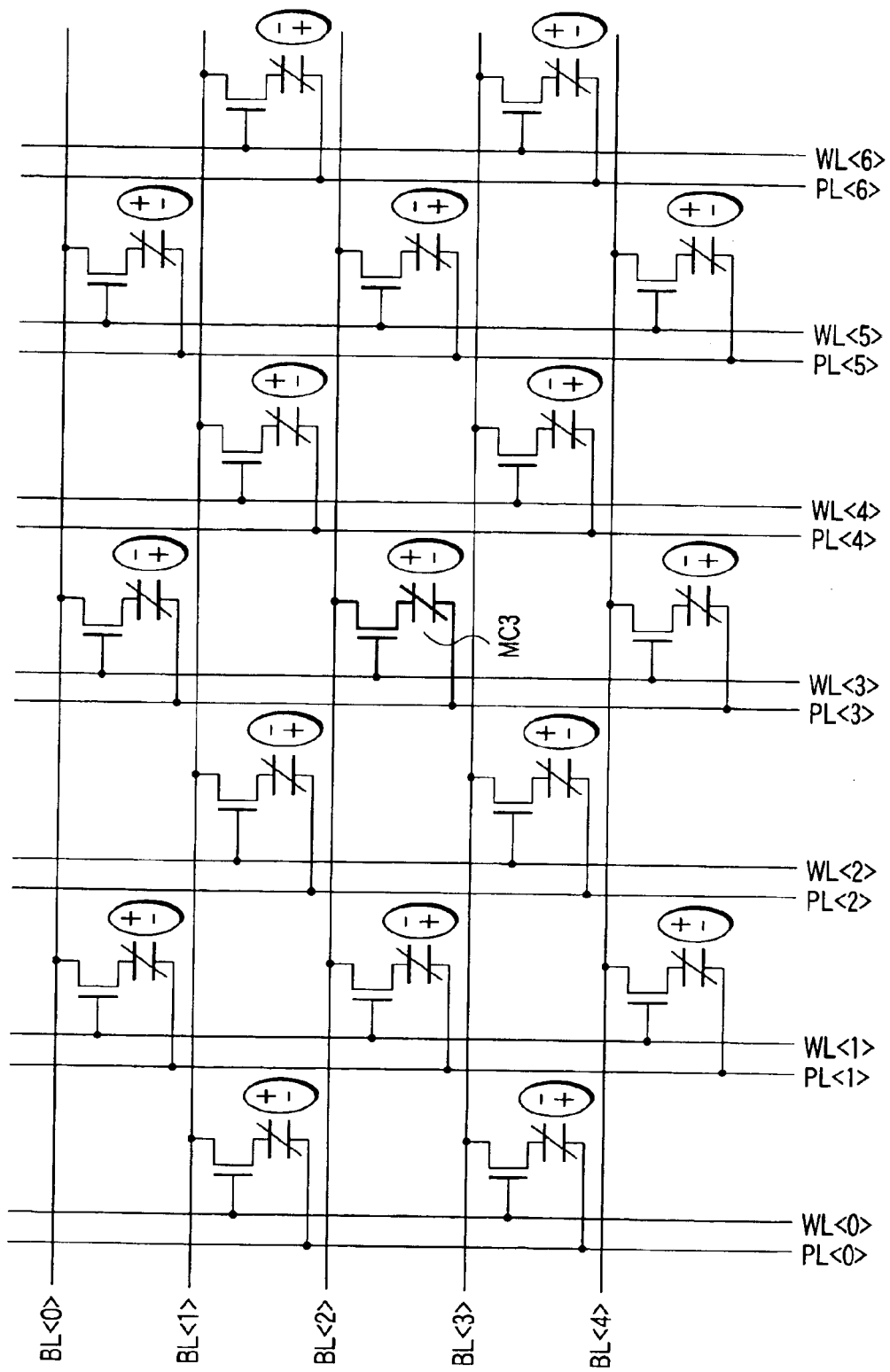
FIG. 22 is a circuit diagram showing a structure of another portion of a cell array of the ferroelectric memory according to the ninth embodiment of the present invention.

For example, as shown in FIGS. 21 and 22, it is supposed that, among the plurality of memory cells connected to the bit line BL<1>, the data "0" is written into the memory cells MC1 and MC2 connected to the word lines WL<0> and WL<4>, and among the plurality of memory cells connected to the bit line BL<2>, the data "0" is written into the memory cell MC3 connected to the word line WL<3>.

Hereinafter, the operation will be described with reference to a timing chart of FIGS. 23A to 23E.

As shown in FIG. 23A, all of the plate lines are equalized to 0V (GND) in advance. Then, column addresses are successively selected. For example, the column address Col. Add.<1> is selected, and the electric potential of the corresponding bit line BL<1> varies from 0V→VTestBL→0V as shown in FIG. 23C. Further, when the column address Col. Add.<1> has been selected, the row addresses Row. Add.<0>, <4>, <8>, . . . are selected, and the electric potentials of the corresponding word lines WL<0>, WL<4>, WL<8>, . . . are applied with the voltage VPP. In accordance therewith, an electric potential difference VtestBL, which is such that the plate line side becomes (−) and the cell transistor side becomes (+), is applied in parallel to the memory cells MC1 and MC2 which are shown in FIG. 21 and into which the data "0" are respectively written. This electric potential difference VTestBL corresponds to the electric potential difference smaller than the absolute value of the coercive voltage described in FIG. 2A. Due to the electric potential difference being applied to the respective cell capacitors of the memory cells MC1 and MC 2, the polarized amounts of these memory cells respectively become polarized amounts which are equal to that after depolarization arises for a short time.

Next, for example, the column address Col. Add.<2> is selected, and the electric potential of the corresponding bit line BL<2> varies from 0V→VTestBL→0V as shown in FIG. 23E. When the column address Col. Add.<2> has been selected, the row addresses Row. Add.<3>, <7>, <11>, . . . are selected, and the electric potentials of the corresponding word lines WL<3>, WL<7>, WL<11>, . . . are raised to VPP. As a result, an electric potential difference VTestBL, which is such that the plate line side becomes (−) and the cell transistor side becomes (+), is applied to the memory cell MC3 which is shown in FIG. 22 and into which the data "0" is written. Due to the electric potential difference being applied to the cell capacitor of the memory cell MC3, the polarized amount of the memory cell becomes polarized amount which is equal to that after depolarization arises for a short time.

Note that, in the case of the present embodiment as well, in the same way as in the cases of the respective first to eighth embodiments, when the electric potential VTestBL is applied to the respective bit lines, due to the electric potential VTestBL being applied in a pulse form plural times consecutively, the electric potential difference VTestBL may be applied plural times consecutively between both electrodes of the respective cell capacitors.

(Tenth Embodiment)

FIG. 24 shows a structure of one portion of the cell array of the TC parallel unit serially-connected type ferroelectric memory shown in FIG. 6. A plurality of bit lines, plate lines, word lines, and block selecting lines are provided in the memory shown in FIG. 24. Among them, four bit lines BL<0> to BL<3>, two plate lines PL<0> and <1>, four word lines WL<0> to WL<3>, and two block selecting lines BS<0> and <1> are illustrated.

Here, applying an electric potential difference smaller than the absolute value of the coercive voltage to the ferroelectric capacitor in step (5) in the test sequence shown in FIG. 1, can be realized by making the cell transistors of the selected unit cells (memory cells) not conductive, and making all of the cell transistors of the unselected unit cells conductive in the respective memory blocks, and by respectively applying a predetermined electric potential difference to the plate lines and the bit lines which are connected to the memory blocks.

For example, in FIG. 24, the data "1" is written in advance into the memory cell MC1 which is provided in the memory block connected to the plate line PL<0> and the bit line BL<2>, and which is connected to the word line WL<1>. The operation at the time of the test mode, in which an electric potential difference smaller than the absolute value of the coercive voltage is applied before the data written in the memory cell MC1 is read, will be described with reference to a timing chart of FIGS. 25A to 25H.

The plate lines PL<0> and PL<1> are equalized to 0V (GND) in advance as shown in FIGS. 25A and 25G.

The control signal PLON falls to "L", and due to the row address Row. Add.<1> being selected, the electric potential of the word line WL<1> which has been applied with VPP in advance falls to 0V (GND) as shown in FIGS. 25C and 25D. Note that the electric potentials of all of the word lines are previously applied with the voltage VPP.

Next, the block selecting line BS<0> is selected, and block selecting NMOS transistors 34 connected to the bit lines BL<0> and BL<2> are made to a conductive state. Accompanying the fall of the control signal /TestPL to "L" after the block selecting line BS<0> arises to "H" (VPP), an electric potential VTestPL of a positive polarity is outputted to the plate line PL<0> as shown in FIG. 25G, and thereafter, the electric potential of the plate line PL<0> falls to the original 0V accompanying the rise of the control signal /TestPL to "H". At this time, all of the bit lines BL<1> to BL<3> other than the bit line BL<0> are equalized to 0V.

After the electric potential of the plate line PL<0> falls to the original 0V as shown in FIG. 25G, as the block selecting line BS<0> falls to "L", the electric potential of the word line WL<1> rises to VPP. Further, the control signal PLON rises to "H" after the word line WL<1> rises to VPP as shown in FIGS. 25C and 25D, and the operation for selecting the memory cell MC1 is completed. Thereafter, step (6) and steps thereafter in the test sequence shown in FIG. 1 are executed.

When the word line WL<1> has been selected, the cell transistor in the memory cell MC1 is made to off state, and all of the cell transistors of the other memory cells in the memory block including the memory cell MC1 are in conductive states. Further, when the word line WL<1> has been selected, if the electric potential of the plate line PL<0> varies from 0V→VTestPL→0V, the bit line BL<2> is set to 0V (GND) Therefore, as shown in FIG. 24, an electric potential differences VTestPL, which is such that the electrode at the plate line PL<0> side becomes (+) and the electrode of the bit line BL<2> side becomes (−), is applied to the cell capacitor of the memory cell MC1 in the memory block connected between the plate line PL<0> and the bit line BL<2>. This electric potential difference VTestPL corresponds to the electric potential difference +ΔV described in FIG. 2A. Due to this electric potential difference being applied to the cell capacitor, the polarized amount of the memory cell MC1 becomes a polarized amount which is equal to that after depolarization arises for a short time as shown in FIG. 2A. Accordingly, when reading the data from the memory cell MC1 in the following step, the polarized amount can be evaluated in a short time. Note that, when the data is read from the memory cell MC1, an electric potential difference which is larger than or equal to the coercive voltage larger than the above-described electric potential difference VTestPL is applied to the cell capacitor in the memory cell MC1. This electric potential difference may be the same electric potential difference at the time of writing of the opposite data pattern in step (4) of the sequence in FIG. 1.

By the way, when the electric potential difference VTestPL is applied to the memory cell MC1, this electric potential difference VTestPL is also applied in the same direction to the memory cell MC2 as well, in the memory block, which is connected to the same word line WL<1> to which the above-described memory cell MC1 is connected, and which is connected between the plate line PL<0> and the bit line BL<0>. Namely, a disturbance is applied to the unselected memory cell MC2.

Then, in the embodiment, as shown in FIGS. 25G and 25H, synchronously with making the electric potential of the plate line PL<0> vary from 0V→VTestPL→0V, the electric potential of the bit line BL<0> is made to vary from 0V→VTestBL (=VTestPL)→0V. In accordance therewith, the electric potential difference VTestPL is substantially not applied to the cell capacitor of the cell memory MC2, so that a disturbance is not applied to the memory cell MC2.

Note that, in the tenth embodiment, the case is described in which, after the block selecting line BS<0> falls to "L", the electric potential of the word line WL<1> rises to VPP as shown in FIGS. 25D and 25E, and the operation for selecting the memory cell MC1 is completed. However, as shown by the broken line in FIGS. 25D and 25E, while maintaining the block selecting line BS<0> at "H", and maintaining the electric potential of the word line WL<1> at GND, continuously, the data may be read from the memory cell MC1.

In addition, the case is described in which the electric potential VTestPL is regularly applied when the electric potential VTestPL of a positive polarity is applied to the plate line PL<0>. However, an electric potential VTestPL may be applied in a pulse form plural times consecutively. In this case, the electric potential difference VTestPL may be applied plural times consecutively between both electrodes of the cell capacitor.

(Eleventh Embodiment)

FIG. 26 shows a structure of a cell array of a ferroelectric memory according to an eleventh embodiment of the invention. This cell array is structured in the similar way as that of the tenth embodiment shown in FIG. 24.

In the tenth embodiment, the case is described in which an electric potential difference smaller than the absolute value of the coercive voltage is applied to the memory cell before the data is read from the memory cell into which the data "1" has been written in advance. On the contrary, in the eleventh embodiment, an electric potential difference smaller than the absolute value of the coercive voltage is applied to the memory cell into which the data "0" has been written in advance.

Next, for example, the data "0" is written in advance into the memory cell MC1 which is provided in the memory block connected between the plate line PL<0> and the bit line BL<2> in FIG. 26 and which is connected to the word line WL<1>. The operation at the time of applying an electric potential difference smaller than the absolute value of the coercive voltage before the data written in the memory cell MC1 is read, will be described with reference to a timing chart of FIGS. 27A to 27F.

The plate line PL<0> is equalized to 0V (GND) in advance as shown in FIG. 27A. First, the potential of the control signal line EQL falls to "L" as shown in FIG. 27B. Thereafter, due to the row address Row Add.<1> which corresponds to the word line WL<1> being selected shown in FIG. 27C, the electric potential of the word line WL<1> which has been applied with a voltage VPP in advance falls to 0V (GND).

Next, a block selecting line BS<0> is selected as shown in FIG. 27D, and block selecting NMOS transistors 34 connected to the bit lines BL<0> and BL<2> are made to conductive state. Accompanying the rise of the control signal TestBL to "H" after the block selecting line BS<0> arises to "H", the electric potential VTestBL of a positive polarity is outputted to the bit line BL<2>, and after the control signal TestBL falls to "L", the electric potential of the bit line BL<2> falls to the original 0V. At this time, all of the other bit lines other than the bit line BL<2> are equalized to 0V (GND).

The electric potential of the bit line BL<2> falls to 0V accompanying the fall of the control signal TestBL falling to "L", and thereafter, as the block selecting line BS<0> falls to "L", the electric potential of the word line WL<1> returns to original VPP. Moreover, the control signal line EQL rises to "H", and the operation for selecting the memory cell MC1 is completed. Thereafter, step (6) and the following steps in the test sequence shown in FIG. 1 are executed.

By the way, when the word line WL<1> has been selected, the cell transistor in the memory cell MC1 is made to not conductive stage, and the respective cell transistors of all of the other memory cells in the memory block are in the conductive states. Further, when the word line WL<1> has been selected, if the electric potential of the bit line BL<2> varies from 0V→VTestBL→0V, the plate line PL<0> is set to 0V (GND). Therefore, as shown in FIG. 26, an electric potential difference VTestBL, which is such that the electrode at the plate line PL<0> side becomes (−) and the electrode at the bit line BL<2> side becomes (+), is applied to the cell capacitor of the memory cell MC1 in the memory block connected between the plate line PL<0> and the bit line BL<2>. This electric potential difference VTestBL is smaller than the absolute value of the coercive voltage described in FIG. 2A. Due to this electric potential difference being applied to the cell capacitor, the polarized amount of the memory cell MC1 becomes a polarized amount which is equal to that after depolarization arises for a short time. Accordingly, when reading the data from the memory cell MC1 in the following step, the polarized amount can be evaluated in a short time.

Note that, in the eleventh embodiment, the case is described in which, after the block selecting line BS<0> falls to "L", the electric potential of the word line WL<1> rises to VPP, and the operation for selecting the memory cell MC1 is completed. However, as shown by the broken line in FIGS. 27C and 27D, while maintaining the block selecting line BS<0> at "H" and maintaining the electric potential of the word line WL<1> at GND, and continuously, the data may be read from the memory cell MC1.

In addition, the case is described in which the electric potential VTestBL is regularly applied when the electric potential VTestBL of a positive polarity is applied to the bit line BL<2>. However, the electric potential VTestBL may be applied in a pulse form plural times consecutively. In this case, the electric potential difference VTestBL is applied plural times consecutively between both electrodes of the cell capacitor.

(Twelfth Embodiment)

Figure 28:
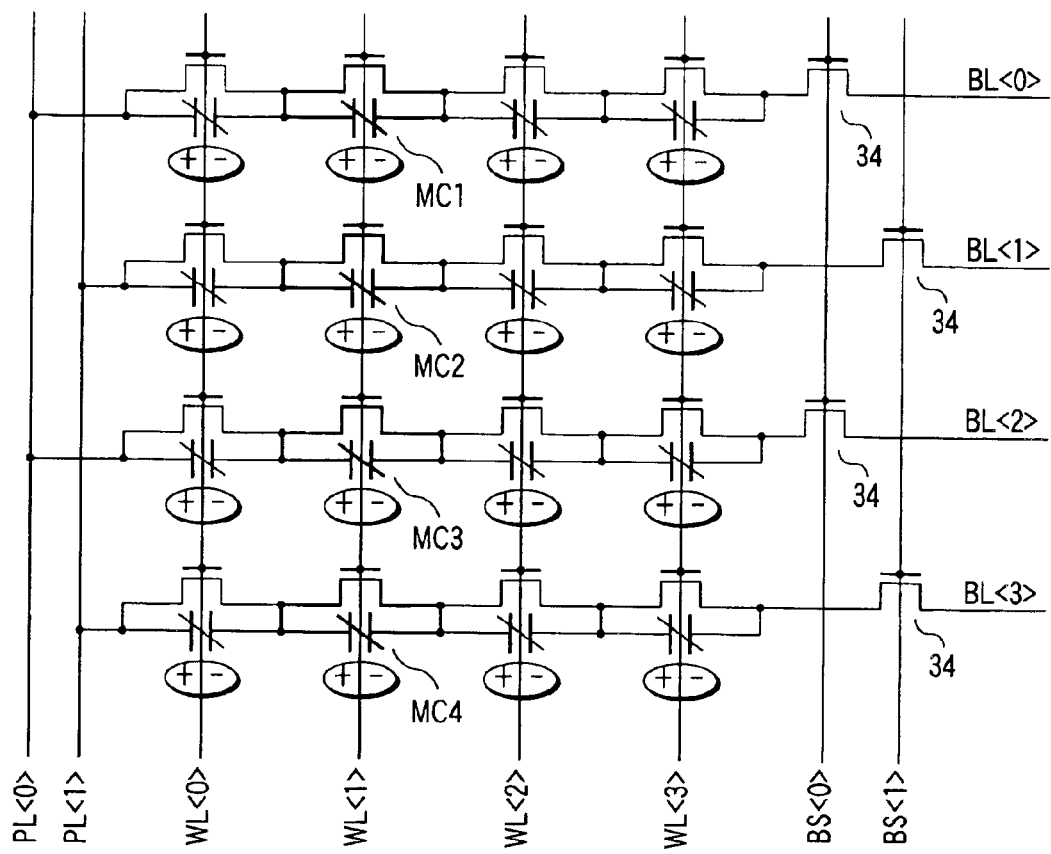
FIG. 28 is a circuit diagram showing a structure of a portion of a cell array of a ferroelectric memory according to a twelfth embodiment of the present invention.

FIG. 28 shows a structure of one portion of a cell array of a ferroelectric memory according to a twelfth embodiment of the invention. This cell array is structured in the similar way as that of the tenth embodiment shown in FIG. 24.

In the tenth and eleventh embodiments, the case is described in which, in the TC parallel unit serially-connected type ferroelectric memory, an electric potential difference smaller than the absolute value of the coercive voltage is applied to the memory cell before the data is read from the specific one memory cell into which the data "1" or "0" is written in advance. On the contrary, in the twelfth embodiment, the data "1" is written into all of the memory cells in the cell array in advance, and an electric potential difference which has an electric field directed so as to weaken polarization and which is smaller than the absolute value of the coercive voltage is applied to these memory cells.

Next, the operation will be described with reference to a timing chart of FIGS. 29A to 29F.

All of the bit lines are equalized to 0V (GND) in advance as shown in FIG. 29A. Further, all of the word lines are supplied with VPP in advance. In this state, row addresses are successively selected, and the electric potentials of the plurality of word lines fall from VPP to 0V in order from the word line WL<0>. Then, for a period of selecting the word lines in which the electric potentials of the respective word lines have been 0V, both block selecting lines BS<0,1> (wherein BS<0,1> expresses BS<0> and BS<1>) become "H", and all of the block selecting NMOS transistors 34 connected to the respective bit lines BL<0> and BL<2> are made to a conductive state. Moreover, the electric potentials of all of the plate lines PL<0,1>(PL<0,1> expresses PS<0> and PS<1>) vary from 0V→VTestPL→0V for the periods of selecting the respective word lines.

For example, for the period of selecting the word line WL<1>, as shown in FIG. 28, transistor switches 31 in all of the memory cells MC1, MC2, MC3, and MC4 in which the gate electrodes are connected to the word line WL<1> in the respective memory blocks, are made to be in non-conductive states. At this time, the cell transistors in the other memory cells are in conductive states, and as shown in FIG. 28, an electric potential difference VTestPL, which is such that the electrodes at the plate line PL<0,1> sides become (+) and the electrode at the bit line side becomes (−), is applied to the respective cell capacitors of the memory cells MC1, MC2, MC3, and MC4. This electric potential difference VTestPL is smaller than the absolute value of the coercive voltage described in FIG. 2A. Due to this electric potential difference being applied to the cell capacitors, the polarized amounts of the memory cells MC1, MC2, MC3, and MC4 become polarized amounts which are equal to that after depolarization arises for a short time. Accordingly, when readings of the data from the memory cells MC1, MC2, MC3, and MC4 are carried out in the following step, the polarized amounts can be evaluated in a short time.

Note that, in the twelfth embodiment, the case is described in which the electric potential VTestPL is regularly applied when the electric potential VTestPL of a positive polarity is applied to the plate lines PL<0,1>. However, the electric potential VTestPL may be applied in a pulse form plural times consecutively. In this case, the electric potential difference VTestPL is applied plural times consecutively between both electrodes of the cell capacitor.

(Thirteenth Embodiment)

FIG. 30 shows a structure of one portion of a cell array of a ferroelectric memory according to a thirteenth embodiment of the invention. This cell array is structured in the similar way as that of the eleventh embodiment shown in FIG. 26.

In the twelfth embodiment, the data "1" is written into all of the memory cells in advance, and the electric potential difference which has an electric field having the direction from the plate line to the bit line, and which is smaller than the absolute value of the coercive voltage, is applied to these memory cells.

On the contrary, in the thirteenth embodiment, the data "0" is written into all of the memory cells in advance, and an electric potential difference which has an electric field having the direction from the bit line to the plate line, and which is smaller than the absolute value of the coercive voltage, is applied to these memory cells.

Next, the operation will be described with reference to a timing chart of FIGS. 31A to 31F.

All of the plate lines PL<0,1> are equalized to 0V (GND) in advance as shown in FIG. 31A. Further, all of the word lines are applied with the voltage VPP. In this state, the row addresses are successively selected, and the electric potentials of the plurality of word lines fall from VPP to 0V in order from the word line WL<0>, as shown in FIGS. 31B to 31D, for example. Then, for the period of selecting the word lines in which the electric potentials of the respective word lines have been 0V, block selecting lines BS<0,1> become "H" as shown in FIG. 31E, and all of the selecting NMOS transistors 34 connected to the respective bit lines are made to a conductive state. Moreover, for the period of selecting the respective word lines, all of the column addresses are selected, and the electric potentials of all of the bit lines BL<0, 1, 2, 3> vary from 0V→VTestBL→0V as shown in FIG. 31F.

For example, for the period of selecting the word line WL<1>, as shown in FIG. 30B, the cell transistors in all of the memory cells MC1, MC2, MC3, and MC4 in which the gate electrodes are connected to the word line WL<1> in the respective memory blocks, are made to be in non-conductive states. At this time, the cell transistors in the other memory cells are in conductive states, and as shown in FIG. 30F, an electric potential differences VTestBL, which is such that the electrodes at the plate line PL<0,1> sides become (+) and the electrode at the bit line side becomes (−), is applied to the respective cell capacitors of the memory cells MC1, MC2, MC3, and MC4. This electric potential difference VTestBL is smaller than the absolute value of the coercive voltage described in FIG. 2A. Due to this electric potential difference being applied to the cell capacitors, the respective polarized amounts of the memory cells MC1, MC2, MC3, and MC4 become polarized amounts which are equal to that after depolarization arises for a short time. Accordingly, when readings of the data from the memory cells MC1, MC2, MC3, and MC4 are carried out in the following step, the polarized amounts can be evaluated in a short time.

Note that, in the thirteenth embodiment, the case is described in which the electric potential VTestBL is regularly applied when the electric potential VTestBL of a positive polarity is applied to the bit lines BL<0,1>. However, the electric potential VTestBL may be applied in a pulse form plural times consecutively. In this case, the electric potential difference VTestBL is applied plural times consecutively between both electrodes of the cell capacitor.

(Fourteenth Embodiment)

In a fourteenth embodiment of the invention, in a TC parallel unit serially-connected type ferroelectric memory having a cell array structured in the similar way as in the eleventh embodiment shown in FIG. 26, at the ferroelectric memory into which a so-called checker pattern in which the data items "1", "0"are arranged in a checker form is written, an electric potential difference which has an electric field having the direction from the plate line to the bit line, and which is smaller than the absolute value of the coercive voltage, is applied to the memory cell into which the data "1" is written.

Figure 32:
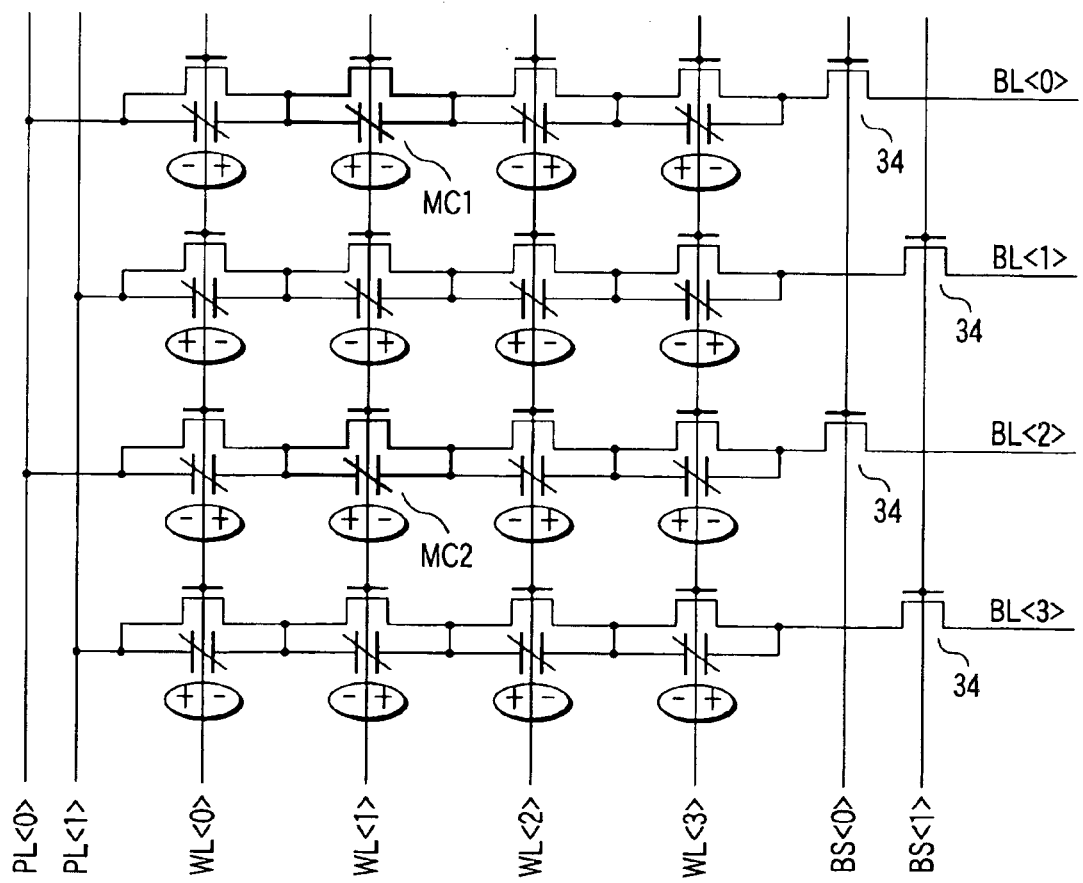
FIG. 32 is a circuit diagram showing a structure of a portion of a cell array of a ferroelectric memory according to a fourteenth embodiment of the present invention.

For example, as shown in FIG. 32, it is supposed that, among the plurality of memory cells connected to the word line WL<1>, the data "1" is written into the memory cells MC1 and MC2 connected to the bit lines BL<0> and BL<2> in the memory block, and the data "0" is written into the memory cells connected to the bit lines BL<1> and BL<3> in the memory block. As shown in FIG. 33, it is supposed that, among the plurality of memory cells connected to the word line WL<2>, the data "1" is written into the memory cells MC3 and MC4 connected to the bit lines BL<1> and BL<3> in the memory block, and the data "0" is written into the memory cells connected to the bit lines BL<0> and BL<2> in the memory block.

Hereinafter, the operation will be described with reference to a timing chart of FIGS. 34A to 34G.

All of the bit lines and plate lines are respectively equalized to 0V (GND) in advance as shown in FIG. 34A. Further, all of the word lines are applied with VPP in advance. In this state, row addresses are successively selected, and the electric potentials of the plurality of word lines fall from VPP to 0V in order from the word line WL<0> as shown in FIGS. 34B and 34C, for example. The block selecting line BS<0> becomes "H" for the period of selecting the word line WL<1> in which the electric potential of the word line WL<1> has been 0V as shown in FIG. 34D, and all of the selecting NMOS transistors 34 connected to the respective bit lines BL<0> and BL<2> are made to a conductive state. Moreover, the electric potential of all of the plate line PL<0> varies from 0V→VTestPL→0V for a period of selecting the word line WL<1> as shown in FIG. 34F.

For the period of selecting the word line WL<1>, the cell transistors in the memory cells MC1 and MC2 in which the gate electrodes are connected to the word line WL<1> are made to be in non-conductive states. Further, all of the cell transistors in the other memory cells in the memory block are made to a conductive state. At this time, because the block selecting line BS<1> is at "L", and the block selecting NMOS transistors 34 connected to the bit lines BL<1> and BL<3> are made to be in non-conductive states, as shown in FIG. 32, an electric potential difference VTestPL, which is such that the electrode at the plate line PL<0> side becomes (+) and the electrode of the bit line side becomes (−), is applied to the respective cell capacitors of the memory cells MC1 and MC2. This electric potential difference VTestPL is smaller than the absolute value of the coercive voltage described in FIG. 2A. Due to the electric potential difference being applied to the cell capacitors, the respective polarized amounts of the memory cells MC1 and MC2 become polarized amounts which are equal to that after depolarization arises for a short time. Accordingly, when readings of the data from the memory cells MC1, MC2 are carried out in the following step, the polarized amounts can be evaluated in a short time.

Moreover, for the period of selecting the word line WL<2> in which the electric potential of the word line WL<2> has been 0V, the block selecting line BS<1> becomes "H" for a predetermined period, and the block selecting NMOS transistors 34 connected to the bit lines BL<1> and BL<3> are made to a conductive state. The electric potential of the plate line PL<1> varies from 0V→VTestPL→0V for the period of selecting the word line WL<2> as shown in FIGS. 34C and 34G. For the period of selecting the word line WL<2>, the cell transistors in the memory cells MC3 and MC4 in which the gate electrodes thereof are connected to the word lines WL<2> are made to be in non-conductive states. Further, all of the cell transistors in the other memory cells in the memory block are made to be a conductive state. At this time, the block selecting line BS<0> is at "L", and the block selecting NMOS transistors 34 connected to the bit lines BL<0> and BL<2> are made to be in non-conductive states.

In accordance with the above-described operation, as shown in FIG. 33, the electric potential difference VTestPL, which is such that the electrode at the plate line PL<1> side becomes (+) and the electrode of the bit line side becomes (−), is applied to the respective cell capacitors of the memory cells MC3 and MC4, and in the same way as in the above-described case, the respective polarized amounts of the memory cells MC3 and MC4 become polarized amounts which are equal to that after depolarization arises for a short time.

Note that, in the fourteenth embodiment, the case is described in which the electric potential VTestPL is regularly applied when the electric potential VTestPL of a positive polarity is respectively applied to the plate lines PL<0> and PL<1>. However, the electric potential VTestPL may be applied in a pulse form plural times consecutively. In this case, the electric potential VTestPL is applied plural times consecutively between both electrodes of the respective cell capacitors.

(Fifteenth Embodiment)

In a fifteenth embodiment, in a TC parallel unit serially-connected type ferroelectric memory having a cell array structured in the similar way as that of the eleventh embodiment shown in FIG. 26, the electric potential difference which has an electric field having the direction from the bit line to the plate line, and which is smaller than the absolute value of the coercive voltage, is applied to the memory cell into which the data "0" of the above-described checker pattern is written.

Figure 35:
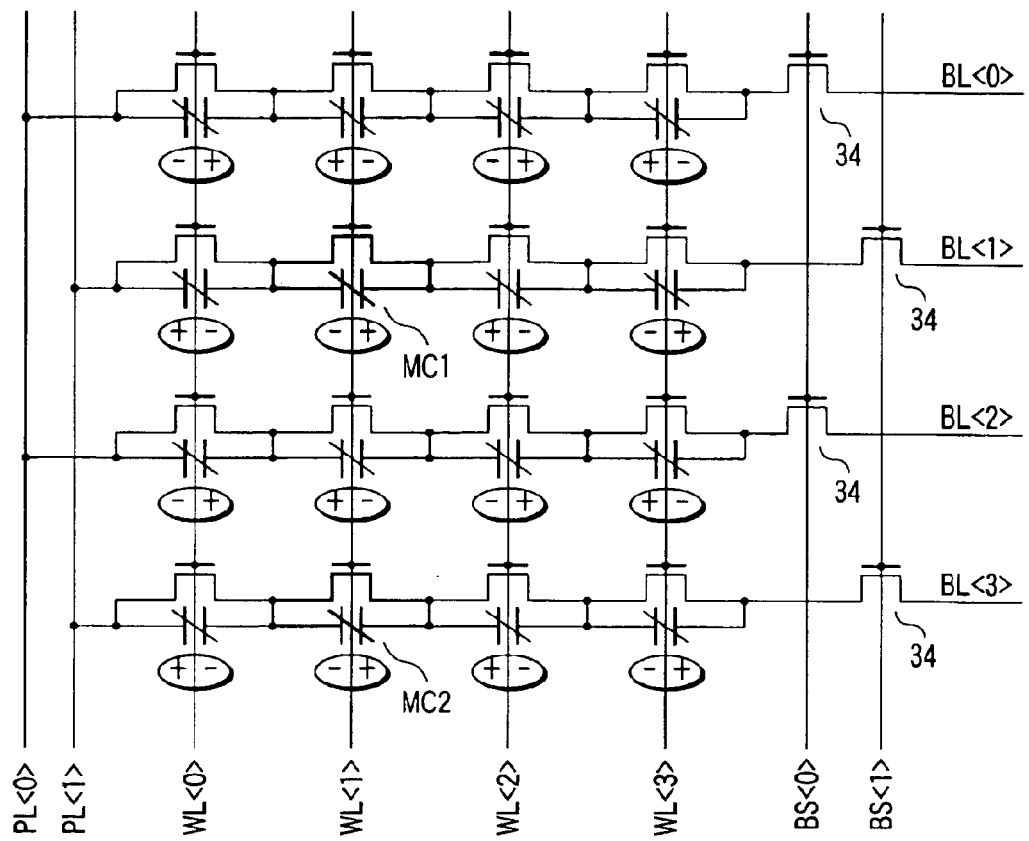
FIG. 35 is a circuit diagram showing a structure of a portion of a cell array of a ferroelectric memory according to a fifteenth embodiment of the present invention.
Figure 36:
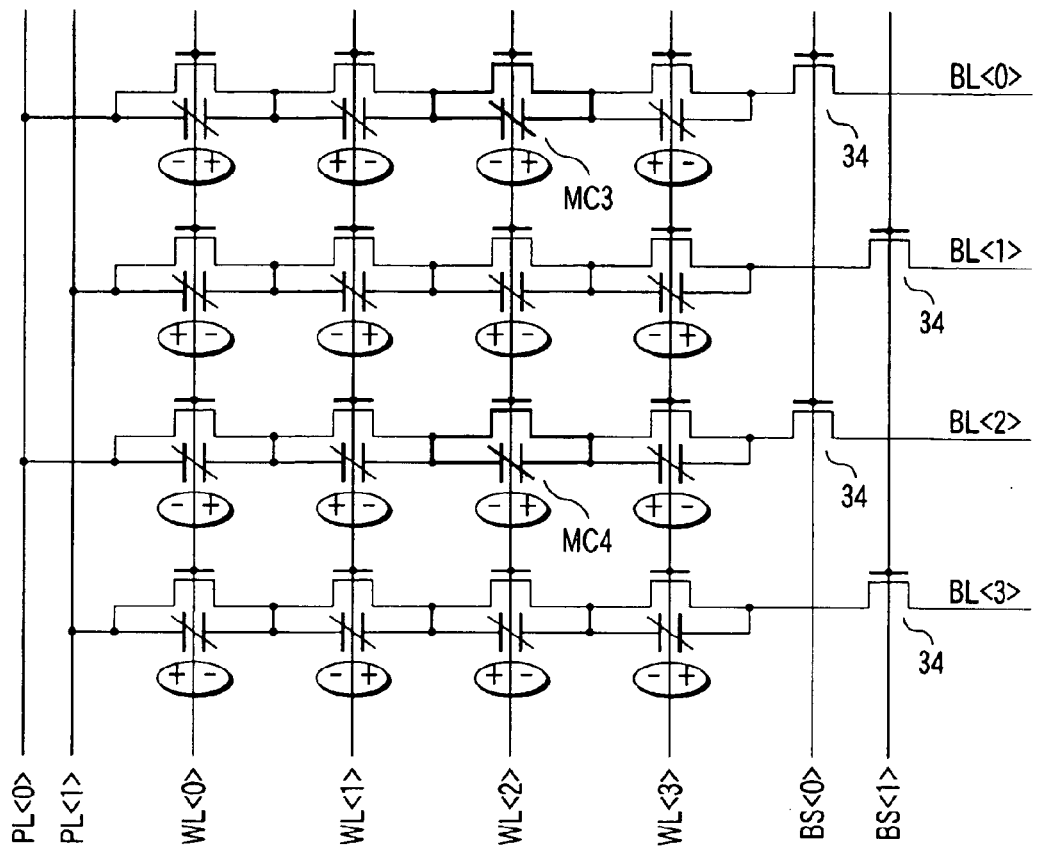
FIG. 36 is a circuit diagram showing a structure of another portion of a cell array of the ferroelectric memory according to the fifteenth embodiment of the present invention.

Note that, for example, as shown in FIG. 35, it is supposed that, among the plurality of memory cells connected to the word line WL<1>, the data "0" is written into the memory cells MC1 and MC2 connected to the bit lines BL<1> and BL<3> in the memory block, and the data "1" is written into the memory cells connected to the bit lines BL<0> and BL<2> in the memory block. On the other hand, as shown in FIG. 36, it is supposed that, among the plurality of memory cells connected to the word line WL<2>, the data "0" is written into the memory cells MC3 and MC4 connected to the bit lines BL<0> and BL<2> in the memory block, and the data "1" is written into the memory cells connected to the bit lines BL<1> and BL<3> in the memory block.

Hereinafter, the operation will be described with reference to a timing chart of FIGS. 37A to 37G.

All of the plate lines and bit lines are respectively equalized to 0V (GND) in advance as shown in FIG. 37A. Further, all of the word lines are applied with the voltage VPP in advance. In this state, the row addresses are successively selected, and the electric potentials of the plurality of word lines fall from VPP to 0V in order from the word line WL<0>. For example, for the period of selecting the word line WL<1> as in FIG. 37B in which the electric potential of the word line WL<1> has been 0V, block selecting line BS<0> becomes "H" for a predetermined period as shown in FIG. 37D, and the block selecting NMOS transistors 34 connected to the bit lines BL<1> and BL<3> are made to be a conductive state. Moreover, the electric potentials of all of the bit lines PL<1,3> vary from 0V→VTestBL→>0V for the period of selecting the word line WL<1> as shown in FIG. 37F.

For the period of selecting the word line WL<1>, the cell transistors in the memory cells MC1 and MC2 in which the gate electrodes are connected to the word line WL<1> are made to be in non-conductive states. Further, all of the cell transistors in the other memory cells are made to be conductive state. At this time, as shown in FIG. 35, an electric potential differences VTestBL, which is such that the electrodes at the bit line BL<1,3> sides become (+) and the electrode of the plate line PL<1> side becomes (–), is applied to the respective cell capacitors of the memory cells MC1 and MC2. This electric potential difference VTestBL is smaller than the absolute value of the coercive voltage described in FIG. 2A. Due to the electric potential difference being applied to the cell capacitors, the respective polarized amounts of the memory cells MC1 and MC2 become polarized amounts which are equal to that after depolarization arises for a short time. Accordingly, when readings of the data from the memory cells MC1, MC2 are carried out in the following step, the polarized amounts can be evaluated in a short time.

Note that, because the block selecting line BS<1> is at "L" for the period of selecting the word line WL<1>, and the block selecting NMOS transistors 34 connected to the bit lines BL<0> and BL<2> are made to be in non-conductive states, the above-described electric potential difference VTestBL is not applied to the memory blocks other than the memory blocks including the memory cells MC1 and MC2.

Moreover, for the period of selecting the word line WL<2> in which the electric potential of the word line WL<2> has been 0V, the block selecting line BS<1> becomes "H" for a predetermined period, and the block selecting NMOS transistors 34 connected to the bit lines BL<0> and BL<2> are made to be in conductive state. Further, the electric potentials of the bit lines BL<0,2> vary from 0V→VTestBL→0V for the period of selecting the word line WL<2> as shown in FIGS. 37C and 37G. For the period of selecting the word line WL<2>, the cell transistors in the memory cells MC3, MC4 in which the gate electrodes thereof are connected to the word line WL<2> are made to be in non-conductive states. All of the cell transistors in the other memory cells in the memory block are made to be in a conductive state. At this time, as shown in FIG. 36, an electric potential difference VTestBL, which is such that the electrodes at the bit line BL<0,2> sides become (+) and the electrode of the plate line PL<0> side becomes (–), is applied to the respective cell capacitors of the memory cells MC3 and MC4. Due to the electric potential difference being applied to the cell capacitors of the cells MC3 and MC4, the respective polarized amounts of the memory cells MC3 and MC4 become polarized amounts which are equal to that after depolarization arises for a short time.

Note that, for the period of selecting the word line WL<2>, the block selecting line BS<1> is at "L", and because the block selecting NMOS transistors 34 connected to the bit lines BL<1> and BL<3> are made to be in non-conductive states, the above-described electric potential difference VTestBL is not applied to the memory blocks other than the memory blocks including the memory cell MC3, MC4.

Note that, in the fifteenth embodiment, the case was described in which the electric potential VTestBL is regularly applied when the electric potential VTestBL of a positive polarity is respectively applied to the bit lines PL<0,1,2,3>. However, the electric potential VTestBL may be applied in a pulse form plural times consecutively. In this case, the electric potential VTestBL is applied plural times consecutively between both electrodes of the respective cell capacitors.

Figure 38:
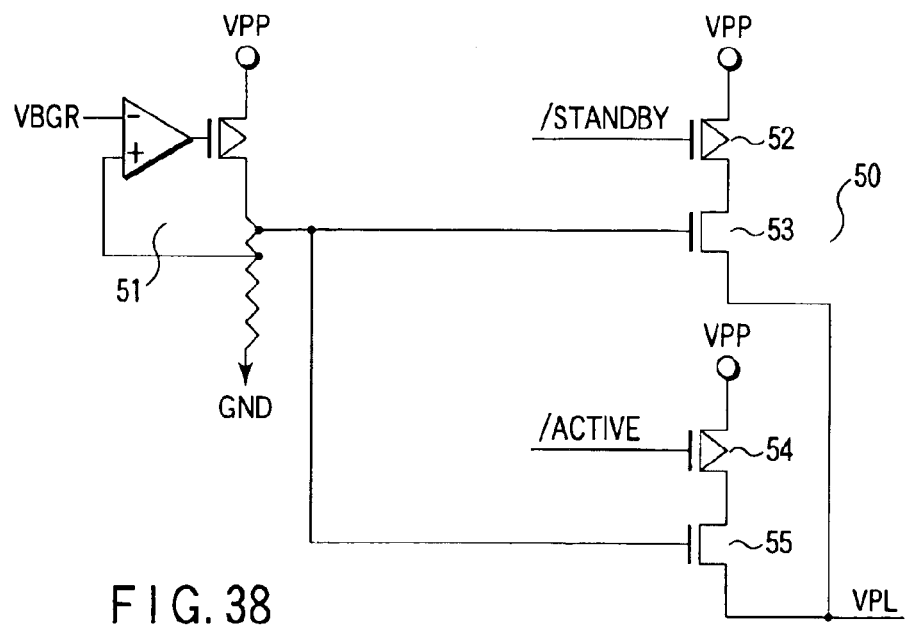
FIG. 38 is a circuit diagram showing an example of an electric potential generating circuit which generates a plate line electric potential for use in the ferroelectric memory of the respective embodiments according to the present invention.

FIG. 38 shows an example of an electric potential generating circuit 50 which generates a plate line electric potential VPL supplied at the time of usual operation, for the plate line in the ferroelectric memory in the respective embodiments. The electric potential generating circuit 50 is formed on a semiconductor chip along with the circuits or the like shown in FIGS. 4 to 6.

The electric potential generating circuit 50 has a constant voltage outputting circuit 51, a PMOS transistor 52, an NMOS transistor 53, a PMOS transistor 54, and an NMOS transistor 55. The constant voltage outputting circuit 51 outputs a constant voltage smaller than a voltage VPP on the basis of a reference voltage VBGR which is generated in a well-known band gap type reference voltage generating circuit and in which a voltage change due to the temperature change thereof is little. In the PMOS transistor 52, the source is connected to a node of voltage VPP and a standby control signal /STANDBY is inputted to the gate electrode. In the NMOS transistor 53, the source-drain path is inserted between the drain of the above-described PMOS transistor 52 and the node of the plate line electric potential VPL, and the output of the constant voltage outputting circuit 51 is inputted to the gate electrode of the transistor 53. In the PMOS transistor 54, the source is connected to the node of electric potential VPP, and an activating signal /ACTIVE is inputted to the gate electrode of the transistor 54. In the NMOS transistor 55, the source-drain path is inserted between the drain of the above-described PMOS transistor 54 and the node of plate line electric potential VPL, and the output of the constant voltage outputting circuit 51 is also inputted to the gate electrode of the transistor 55.

An element size of the NMOS transistor 53 is relatively made small, and an element size of the NMOS transistor 55 is relatively made large, and an electric current larger than that at the NMOS transistor 53 is made to flow at the NMOS transistor 55. In accordance therewith, an element size of the PMOS transistor 52 is relatively made small, and an element size of the PMOS transistor 54 is relatively made large.

Here, when the ferroelectric memory of the respective embodiments is in a standby state, i.e., in a state of low electric power consumption in which writing or reading of data is not carried out in the memory cell, the standby control signal /STANDBY becomes "L". At this time, the PMOS transistor 52 is made to be in a conductive state, due to relatively small electric current being made to flow via the NMOS transistor 53, a plate line potential VPL is generated.

On the other hand, when the ferroelectric memory is in an active state, i.e., in a state in which writing or reading of data is carried out in the memory cell, the activating control signal /ACTIVE becomes "L". At this time, the PMOS transistor 54 is turned on, due to relatively large electric current being made to flow via the NMOS transistor 55, a plate line potential VPL is generated. At this time, the standby control signal /STANDBY is "L" as is, and the PMOS transistor 52 is in a conductive state as is, and electric current continues to flow. However, as compared with the electric current amount of the electric current flowing in series via the PMOS transistor 54 and the NMOS transistor 55, the electric current amount of the electric current flowing in series via the PMOS transistor 52 and the NMOS transistor 53 is small enough to be ignored.

Figure 39:
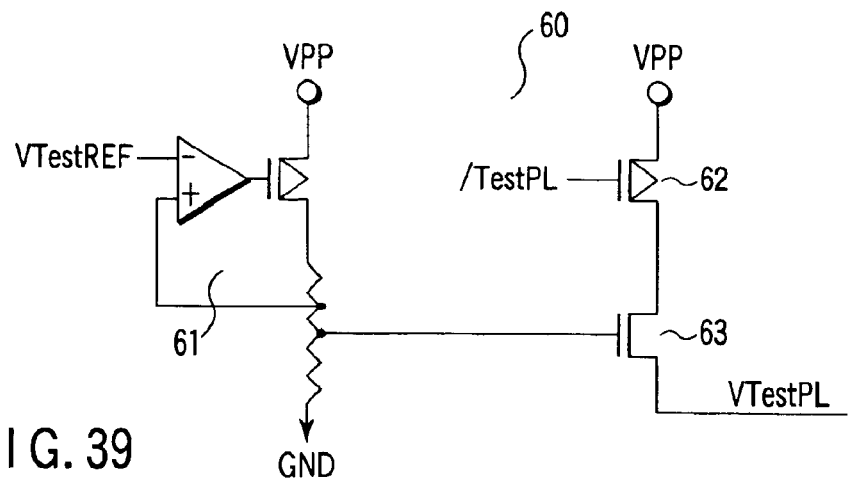
FIG. 39 a circuit diagram showing an example of an electric potential generating circuit which generates a testing plate line electric potential for use in the ferroelectric memory of the respective embodiments according to the present invention.

FIG. 39 shows an example of an electric potential generating circuit 60 for generating a testing plate line electric potential VTestPL which is supplied at the time of the test mode, for the plate line in the ferroelectric memory in the respective embodiments. The electric potential generating circuit 60 is formed on a semiconductor chip along with the circuits or the like shown in FIGS. 4 to 6.

The electric potential generating circuit 60 has a constant voltage outputting circuit 61, a PMOS transistor 62, and an NMOS transistor 63. The constant voltage outputting circuit 61 outputs a constant voltage smaller than the voltage VPP on the basis of a reference voltage VTestRFF which is generated by using a reference voltage VBGR in FIG. 38. The reference voltage VTestREF is smaller than the reference voltage VBGR. In the PMOS transistor 62, the source thereof is connected to a node of voltage VPP and a control signal /TestPL which becomes "H" at the time of the test mode is inputted to the gate electrode thereof. In the NMOS transistor 63, the source-drain path is inserted between the drain of the above-described PMOS transistor 62 and the node of the plate line electric potential VTestPL, and the output of the constant voltage outputting circuit 61 is inputted to the gate electrode of the transistor 63.

In the electric potential generating circuit 60 of FIG. 39, when the control signal /TestPL is at "L", the PMOS transistor 62 is made to be turned on, and an electric current flows via the NMOS transistor 63, and a plate line potential VTestPL at the time of testing is generated.

Figure 40:
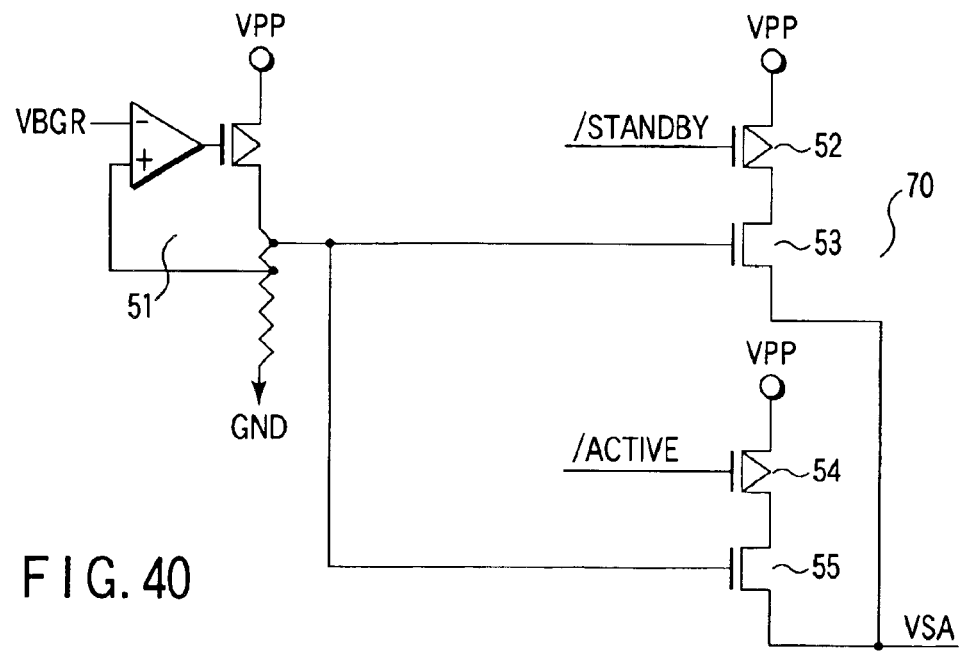
FIG. 40 a circuit diagram showing an example of an electric potential generating circuit which generates an electric potential for activating a bit line sense amplifier for use in the ferroelectric memory of the respective embodiments according to the present invention.

FIG. 40 shows an example of an electric potential generating circuit 70 generating an electric potential VSA used at the time of activating the bit line sense amplifier 13 in the ferroelectric memory in the respective embodiments. The electric potential generating circuit 70 is formed on a semiconductor chip along with the circuits or the like shown in FIGS. 4 to 6.

Because the basic structure of the electric potential generating circuit 70 is in the similar way as that of the electric potential generating circuit 50 shown in FIG. 38, parts corresponding to that of FIG. 38 are denoted by the same reference numerals, and description thereof will be omitted. Further, the basic operation of the electric potential generating circuit 70 as well is in the similar way as that of the electric potential generating circuit 50 shown in FIG. 38.

Figure 41:
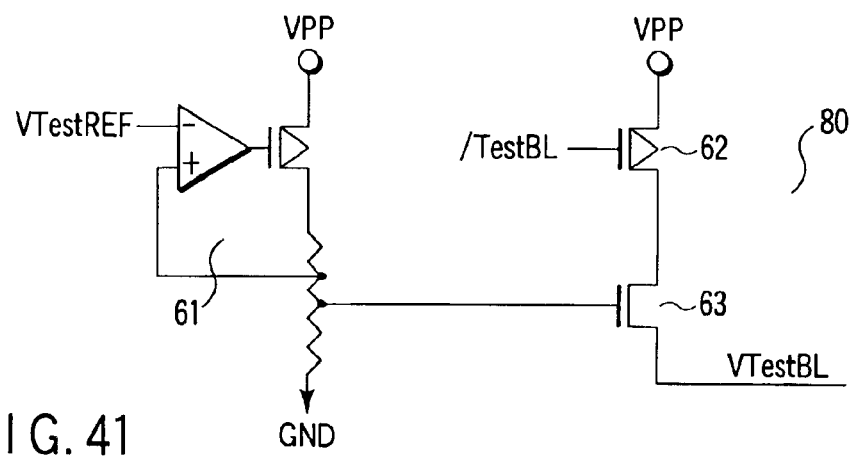
FIG. 41 a circuit diagram showing an example of an electric potential generating circuit which generates a testing bit line electric potential for use in the ferroelectric memory of the respective embodiments according to the present invention.

FIG. 41 shows an example of an electric potential generating circuit 80 for generating a bit line electric potential VTestBL supplied at the time of testing, for the bit line in the ferroelectric memory in the respective embodiments. The electric potential generating circuit 80 is formed on a semiconductor chip along with the circuits or the like shown in FIGS. 4 to 6.

Because the basic structure of the electric potential generating circuit 80 is in the similar way as that of the electric potential generating circuit 60 shown in FIG. 39, parts corresponding to that of FIG. 39 are denoted by the same reference numerals, and description thereof will be omitted. Further, the basic operation of the electric potential generating circuit 80 as well is the same with that of the electric potential generating circuit 60 shown in FIG. 39.

Figure 42:
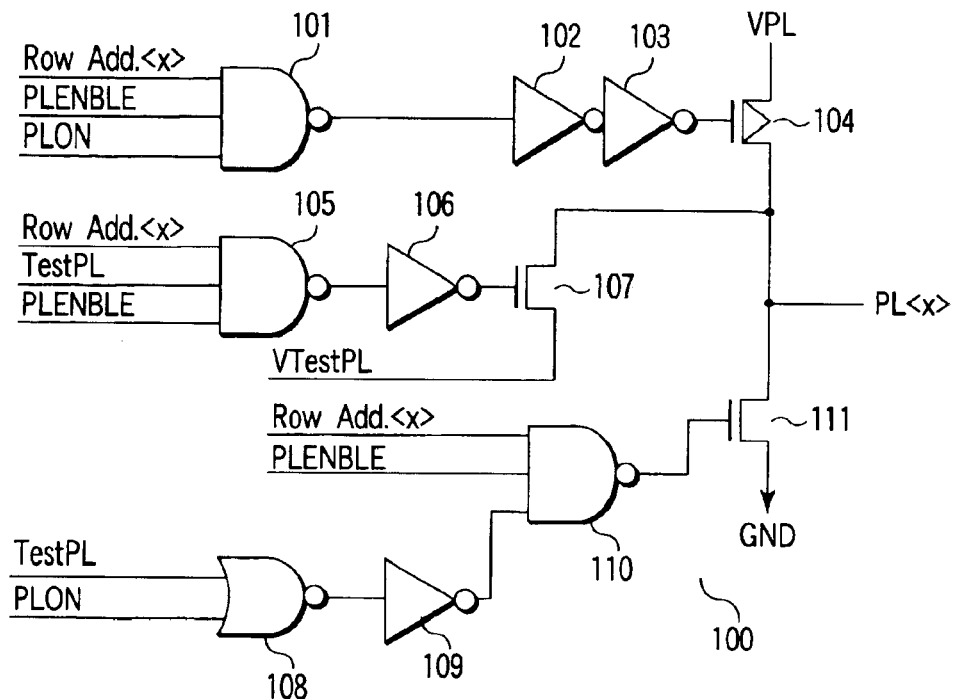
FIG. 42 a circuit diagram showing an example of an electric potential outputting circuit which outputs a plate line electric potential for use in the ferroelectric memory of the first to ninth embodiments according to the present invention.

FIG. 42 shows an example of an electric potential outputting circuit 100 for outputting an electric potential to plate lines PL<x> in the ferroelectric memory in the first to ninth embodiments.

Figure 43:
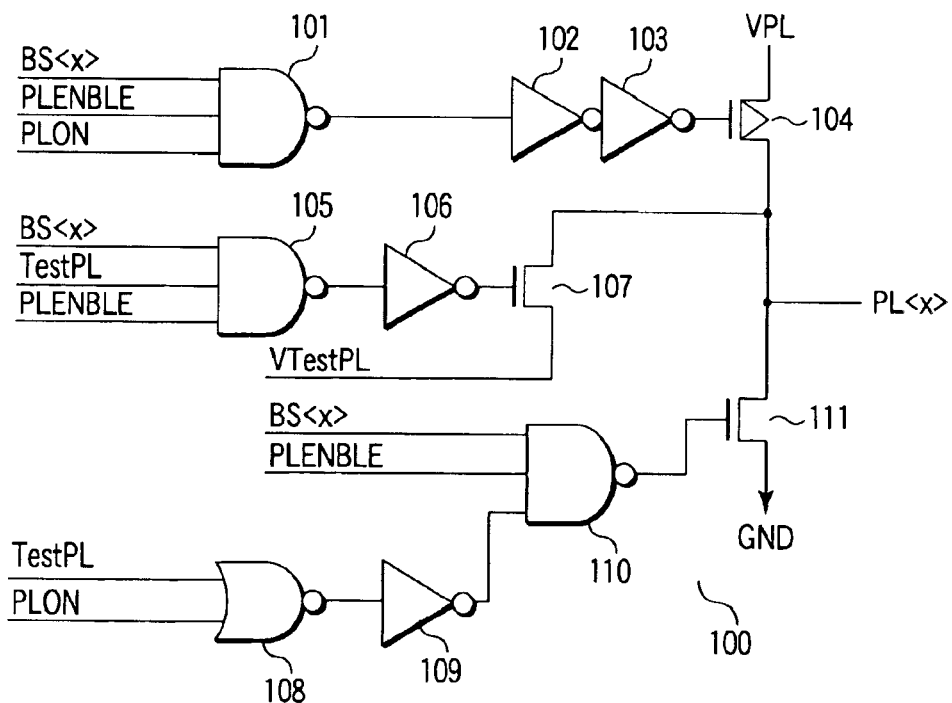
FIG. 43 a circuit diagram showing an example of an electric potential outputting circuit which outputs a plate line electric potential for use in the ferroelectric memory of the tenth to fifteenth embodiments according to the present invention.
Figure 46:
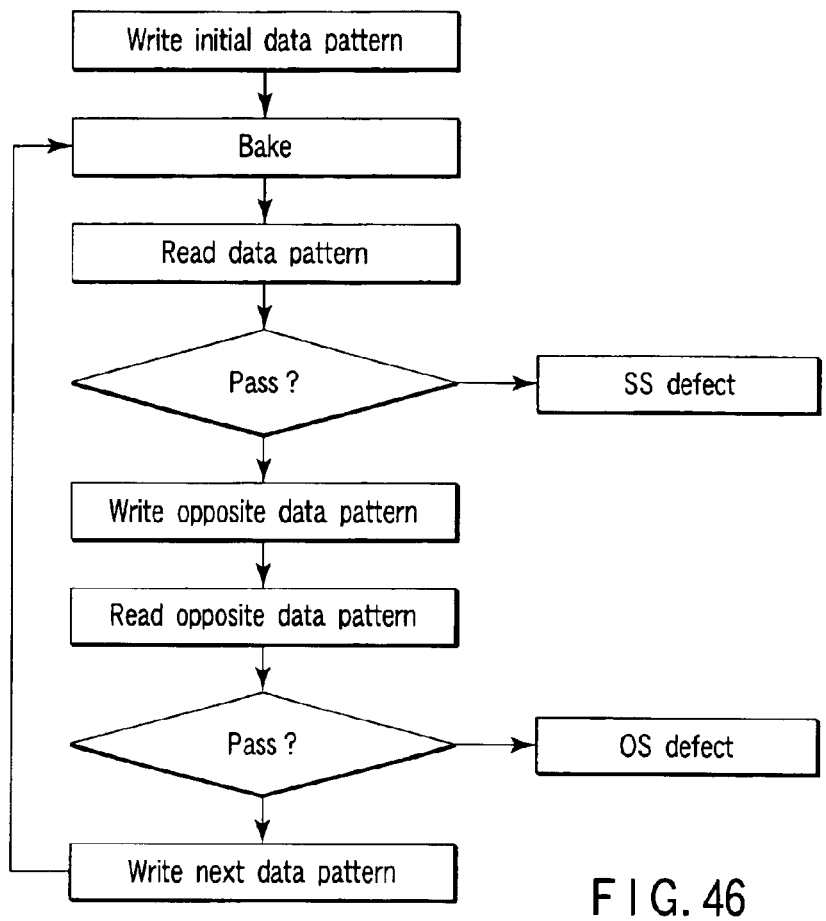
FIG. 46 is a flowchart of a method of testing a conventional ferroelectric memory.
Figure 47:
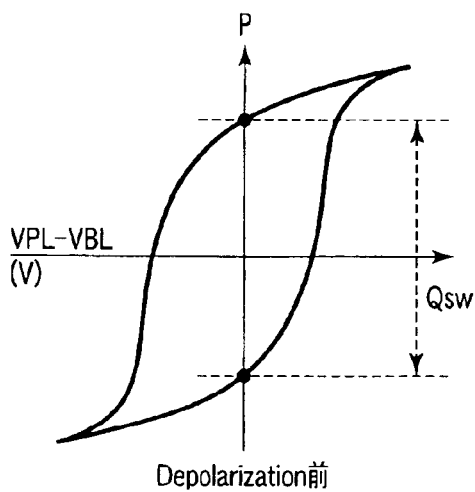
FIG. 47 is a graph showing a hysteresis characteristic curve of the ferroelectric memory cell in a state before depolarization arises.
Figure 48:
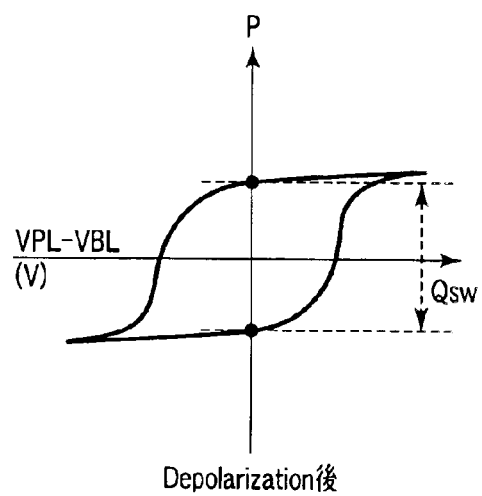
FIG. 48 is a graph showing a hysteresis characteristic curve of the ferroelectric memory cell in a state after depolarization arises.

Further, FIG. 43 shows an example of the electric potential outputting circuit 100 for outputting an electric potential to plate lines PL<x> in the ferroelectric memory in the tenth to fifteenth embodiments.

FIG. 42 shows one example of the electric potential outputting circuit 100 in a case where a 1T-1C type memory cell such as that shown in FIG. 5 is used. The number of electric potential outputting circuits 100 corresponding to the number of the plate lines PL<x> are provided, and are formed on a semiconductor chip along with the circuits or the like shown in FIGS. 4 to 6.

The electric potential outputting circuit 100 has an NAND gate circuit 101, two inverting circuits 102 and 103, a PMOS transistor 104, an NAND gate circuit 105, an inverting circuit 106, an NMOS transistor 107, an NOR gate circuit 108, an inverting circuit 109, an NAND gate circuit 110, and an NMOS transistor 111. The row addresses Row ADD.<x>, the control signal PLENBLE, and the control signal PLON are inputted to the NAND gate circuit 101. The two inverting circuits 102 and 103 are connected in series so as to successively invert the outputs of the NAND gate circuit 101. In the PMOS transistor 104, the source-drain path is inserted between the node of the plate line electric potential VPL generated at the electric potential generating circuit 50 of FIG. 38 and a plate line PL<x>, and the output of the inverting circuit 103 is inputted to the gate electrode of the transistor 104. The row addresses Row Add.<x>, the control signal TestPL, and the control signal PLENBLE are inputted to the NAND gate circuit 105. The inverting circuit 106 inverts the output of the NAND gate circuit 105. In the NMOS transistor 107, the source-drain path is inserted between the plate lines PL<x> and the node of the plate line electric potential VTestPL generated at the electric potential generating circuit 60 of FIG. 39, and the output of the above-described inverting circuit 106 is inputted to the gate electrode of the transistor 107.

The control signal TestPL and the control signal PLON are inputted to the NOR gate circuit 108. The inverting circuit 109 inverts the output of the NOR gate circuit 108. The output of the inverting circuit 109, the control signal PLENABL, and the row addresses Row Add.<x> are inputted to the NAND gate circuit 110. In the NMOS transistor 111, the source-drain path is inserted between the plate lines PL<x> and the node of the ground potential GND, and the output of the NAND gate circuit 110 is inputted to the gate electrode of the transistor 111.

In the electric potential outputting circuit 100 of FIG. 42, both of the control signal PLENBLE and the control signal PLON become "H" at the time of the normal mode, due to the row addresses Row Add.<x> being selected, the output of the NAND gate circuit 101 becomes "L", and the output of the inverting circuit 102 becomes "H", and the output of the inverting circuit 103 becomes "L", and the PMOS transistor 104 is turned on, so that the plate line electric potential VPL generated at the electric potential generating circuit 50 of FIG. 38 is outputted to the plate lines PL<x>. Namely, the circuit formed from the NAND gate circuit 101, the inverting circuits 102 and 103, and the PMOS transistor 104 outputs a normal plate line electric potential VPL to the plate lines PL<x> in accordance with the row addresses Row Add.<x>.

The control signal TestPL becomes "H" at the time of the test mode, and due to the row addresses Row Add.<x> being selected, the output of the NAND gate circuit 105 becomes "L", and the output of the inverting circuit 106 becomes "H", and the NMOS transistor 107 is turned on, so that the plate line electric potential VTestPL generated at the electric potential generating circuit 60 of FIG. 39 is outputted to the plate lines PL<x>. Namely, the circuit formed from the NAND gate circuit 105, the inverting circuit 106, and the NMOS transistor 107 outputs a testing plate line electric potential VTestPL to the plate lines PL<x> in accordance with the row addresses Row Add.<x>.

Moreover, the circuit including the NOR gate circuit 108, the inverting circuit 109, the NAND gate circuit 110, and the NMOS transistor 111 makes the potentials of the plate lines PL<x> to be 0V after row addresses Row Add.<x> are not selected, at the times of the normal mode and the test mode.

FIG. 43 shows an example of the electric potential outputting circuit 100 for use in a TC parallel unit serially-connected type ferroelectric memory such as that shown in FIG. 6. The number of electric potential outputting circuits 100 corresponding to the number of the plate lines PL<x> are provided, and are formed on a semiconductor chip along with the circuits or the like shown in FIG. 4.

The circuit structure of the electric potential outputting circuit 100 shown in FIG. 43 is the same as that of FIG. 42, and differs in only that the row addresses Row Add.<x> in FIG. 42 are replaced with the signals of the block selecting lines BS<x>.

FIG. 44 shows an example of an electric potential outputting circuit 120 for outputting an electric potential to the bit lines BL<x> in the ferroelectric memory of the respective embodiments. The number of electric potential outputting circuits 120 corresponding to the number of the bit lines BL<x> are provided, and are formed on a semiconductor chip along with the circuits or the like shown in FIG. 4, and FIG. 5 or FIG. 6.

The electric potential outputting circuit 120 has an NAND gate circuit 121, an inverting circuit 122, an NMOS transistor 123, an NOR gate circuit 124, an NAND gate circuit 125, and an NMOS transistor 126. The column addresses Col ADD.<x>, the signal of the control signal line /EQL, and the control signal TestBL are inputted to the NAND gate circuit 121. The inverting circuit 122 inverts the output-of the NAND gate circuit 121. In the NMOS transistor 123, the source-drain path is inserted between the node of the testing bit line electric potential VTestBL generated at the electric potential generating circuit 80 of FIG. 41 and bit lines BL<x>, and the output of the inverting circuit 122 is inputted to the gate electrode of the transistor 123. The signal of the control signal line EQL and the control signal /TestBL are inputted to the NOR gate circuit 124. The output of the NOR gate circuit 124 and the column addresses Col Add.<x> are inputted to the NAND gate circuit 125. In the NMOS transistor 126, the source-drain path is inserted between the bit lines BL<x> and the node of the grounded potential GND, and the output of the above-described NAND gate circuit 125 is inputted to the gate electrode of the transistor 126.

In the electric potential outputting circuit 120 of FIG. 44, both of the control signal line EQL and the control signal TestBL become "H" at the time of the test mode, due to the column addresses Col Add.<x> being selected, the output of the NAND gate circuit 121 becomes "L", and the output of the inverting circuit 122 becomes "H", and the NMOS transistor 123 is made to be turned on, and the testing bit line electric potential VTestBL generated at the electric potential generating circuit 80 of FIG. 41 is outputted to the bit lines BL<x>. Namely, the circuit including the NAND gate circuit 121, the inverting circuit 122, and the NMOS transistor 123 outputs a testing bit line electric potential VTestBL to the bit lines BL<x> in accordance with the column addresses Col Add.<x>.

The control signal /TestBL is "L" at the time of the normal mode, and when equalizing/pre-charging operation at the bit line equalizing/pre-charging circuit 11 of FIG. 4 is completed, and the control signal line EQL becomes "L", the output of the NOR gate circuit 124 becomes "H". Further, due to the column addresses Col Add.<x> being selected, the output of the NAND gate circuit 125 becomes "L", and the NMOS transistor 126 is made to be in a non-conductive state, and the bit lines BL<x> maintains the electric potential which has been pre-charged. Thereafter, when the column addresses Col Add.<x> are unselected, the output of the NAND gate circuit 125 becomes "H", and the NMOS transistor 126 is made to be turned on, and the bit lines BL<x> are discharged to GND.

Note that the present invention is not limited to the embodiments described above, and various modifications thereof are possible. For example, the circuits shown in FIGS. 38 to 44 are merely examples, and may be structured in any way provided that they have similar functions. In addition, the present invention can be modified and embodied in various ways within a range which does not deviate from the gist of the present invention.

As described above, in accordance with the present invention, a ferroelectric memory which can evaluate the polarized amount of a ferroelectric memory cell in a short time after writing data, and a testing method thereof can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A ferroelectric memory comprising:
   a plurality of memory cells respectively including ferroelectric capacitors and switch transistors; and
   the ferroelectric memory operating in a test mode in which, after polarized data is written into the memory cells by applying a first electric potential difference between both electrodes of the respective ferroelectric capacitors of the plurality of memory cells, and before reading of the polarized data from the memory cells is carried out, a second electric potential difference smaller than the first electric potential difference is applied between both the electrodes of the ferroelectric capacitors in a direction opposite to that at the time of writing the polarized data.

2. A ferroelectric memory according to claim 1, wherein the first electric potential difference is larger than an absolute value of a coercive voltage on a polarization hysteresis characteristic curve which the ferroelectric capacitors have.

3. A ferroelectric memory according to claim 1, wherein the second electric potential difference has an absolute value smaller than a coercive voltage on a polarization hysteresis characteristic curve which the ferroelectric capacitors have.

4. A ferroelectric memory according to claim 2, wherein the second electric potential difference has an absolute value smaller than the coercive voltage.

5. A ferroelectric memory according to claim 1, wherein the second electric potential difference is applied plural times consecutively between both the electrodes of the ferroelectrode capacitor.

6. A ferroelectric memory according to claim 4, wherein the second electric potential difference is applied plural times consecutively between both the electrodes of the ferroelectrode capacitor.

7. A ferroelectric memory according to claim 1, wherein a third electric potential difference having an absolute value larger than the second electric potential difference is applied between both the electrodes of the ferroelectrode capacitor when reading of the polarized data from the memory cell is carried out.

8. A ferroelectric memory according to claim 5, wherein a third electric potential difference having an absolute value larger than the second electric potential difference is applied between both the electrodes of the ferroelectrode capacitor when reading of the polarized data from the memory cell is carried out.

9. A ferroelectric memory according to claim 6, wherein a third electric potential difference having an absolute value larger than the second electric potential difference is applied between both the electrodes of the ferroelectrode capacitor when reading of the polarized data from the memory cell is carried out.

10. A ferroelectric memory according to claim 7, wherein the first electric potential difference and the third electric potential difference are equivalent.

11. A ferroelectric memory according to claim 1, wherein a circuit which generates the second electric potential difference is formed on a semiconductor chip along with the plurality of memory cells.

12. A ferroelectric memory according to claim 1, wherein one side electric current ends of the switch transistors are connected to one side electrodes of the ferroelectric capacitors of said plurality of memory cells, plate lines are connected to the other side electrodes of the ferroelectric capacitors, bit lines are connected to the other side electric current ends of the switch transistors, and word lines are connected to gate terminals of the switch transistors.

13. A ferroelectric memory according to any one of claim 1, wherein the ferroelectric capacitors in said plurality of memory cells are connected in series, said plurality of memory cells are connected in series due to the one side electrodes and the other side electrodes of the respective switch transistors in said plurality of the memory cells being connected in parallel to the ferroelectric capacitors in the corresponding memory cells, plate lines are connected to the one side ends of said plurality of serially-connected memory cells, bit lines are connected to the other side ends of said plurality of serially-connected memory cells, and word lines are connected to gate terminals of the respective switch transistors.

14. A ferroelectric memory according to claim 1, wherein the test mode is an operation mode which is carried out after an initial data pattern is written into said plurality of memory cells, and an opposite pattern having a pattern opposite to the initial data pattern is written into said plurality of memory cells and before the opposite data pattern is read out.

15. A ferroelectric memory comprising:
a plurality of memory cells respectively including ferroelectric capacitors and switch transistors; and
the ferroelectric memory operating in a test mode in which, after polarized data is written into the respective memory cells by applying a first electric potential difference between both electrodes of ferroelectric capacitors of said plurality of memory cells, and before reading of the polarized data from the memory cells is carried out, a second electric potential difference is applied between both the electrodes of the ferroelectric capacitors so as to weaken polarization.

16. A ferroelectric memory according to claim 15, wherein the second electric potential difference has an absolute value which is smaller than a coercive voltage on a polarization hysteresis characteristic curve which the ferroelectric capacitors have.

17. A method of testing a ferroelectric memory having a plurality of memory cells each including a ferroelectric capacitor and a switch transistor, comprising:
writing polarized data into the memory cells by applying a first electric potential difference between both electrodes of the ferroelectric capacitors of said plurality of memory cells;
weakening polarization of the ferroelectric capacitors by applying a second electric potential difference smaller than the first electric potential difference between both the electrodes of the ferroelectric capacitor of the corresponding memory cell in a direction opposite to that at the time of writing the polarized data; and
reading the polarized data.

18. A method according to claim 17, wherein the second electric potential difference has an absolute value smaller than a coercive voltage on a polarization hysteresis characteristic curve which the ferroelectric capacitors have.

19. A method according to claim 17, wherein the second electric potential difference is applied plural times consecutively between both the electrodes of the ferroelectrode capacitor.

20. A method according to claim 17, wherein a third electric potential difference larger than the second electric potential difference is applied between both the electrodes of the ferroelectrode capacitor when reading of the polarized data from the memory cell is carried out.

21. A method according to claim 17, wherein, when the polarized data is written into the memory cell by applying the first electric potential difference between both the electrodes of the respective ferroelectric capacitors of said plurality of memory cells, an electric potential difference whose absolute value is larger than a coercive voltage on a polarization hysteresis characteristic curve which the ferroelectric capacitor has is applied as the first electric potential difference.

22. A method according to claim 20, wherein the first electric potential difference and the third electric potential difference are equivalent.

23. A method according to claim 17, wherein, when polarized data is written into the memory cell by applying the first electric potential difference between both the electrodes of the respective ferroelectric capacitors of said plurality of memory cells, an initial data pattern is written into said plurality of memory cells in advance, and an opposite data pattern having a pattern opposite to the initial data pattern is written into said plurality of memory cells.

* * * * *